United States Patent
Imaizumi

(10) Patent No.: US 7,088,307 B2
(45) Date of Patent: Aug. 8, 2006

(54) ANTENNA MATCHING CIRCUIT, MOBILE COMMUNICATION DEVICE INCLUDING ANTENNA MATCHING CIRCUIT, AND DIELECTRIC ANTENNA INCLUDING ANTENNA MATCHING CIRCUIT

(75) Inventor: Tatsuya Imaizumi, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 139 days.

(21) Appl. No.: 10/831,464

(22) Filed: Apr. 23, 2004

(65) Prior Publication Data

US 2004/0217915 A1 Nov. 4, 2004

(30) Foreign Application Priority Data

May 2, 2003 (JP) ............................. 2003-127362

(51) Int. Cl.
*H01Q 1/50* (2006.01)
*H03H 7/38* (2006.01)

(52) U.S. Cl. .................... 343/860; 343/862; 333/33
(58) Field of Classification Search ........ 343/860–862; 333/32
See application file for complete search history.

(56) References Cited

U.S. PATENT DOCUMENTS

| | | | | |
|---|---|---|---|---|
| 4,141,016 | A | 2/1979 | Nelson | 343/858 |
| 4,145,693 | A * | 3/1979 | Fenwick | 343/722 |
| 5,083,134 | A * | 1/1992 | Saitou et al. | 343/713 |
| 6,081,242 | A * | 6/2000 | Wingo | 343/860 |
| 6,329,886 | B1 | 12/2001 | Ogoro | 333/32 |
| 2003/0020559 | A1 | 1/2003 | Stewart et al. | 333/32 |
| 2005/0107042 | A1* | 5/2005 | De Graauw | 455/78 |

FOREIGN PATENT DOCUMENTS

| | | |
|---|---|---|
| JP | HEI 5-327331 | 12/1993 |
| JP | 8-148960 | * 6/1996 |
| JP | 2000-286615 | 10/2000 |
| JP | 2002-26624 | * 1/2002 |

* cited by examiner

*Primary Examiner*—Barbara Summons
(74) *Attorney, Agent, or Firm*—Duane Morris LLP

(57) ABSTRACT

In an antenna matching circuit including a parallel resonant section connected to a radiation element constituting an antenna, the parallel resonant section includes a series resonant portion composed of an inductance component and a capacitance component. The series resonant portion realizes antenna matching and band widening. The parallel resonant section can be inserted in a feeder line connected to the radiation element or inserted in a GND line connected to the radiation element.

15 Claims, 25 Drawing Sheets

Prior Art

Prior Art

Prior Art

ANTENNA MATCHING CIRCUIT, MOBILE COMMUNICATION DEVICE INCLUDING ANTENNA MATCHING CIRCUIT, AND DIELECTRIC ANTENNA INCLUDING ANTENNA MATCHING CIRCUIT

FIELD OF THE INVENTION

The present invention relates to an antenna matching circuit, a mobile communication device including an antenna matching circuit, and a dielectric antenna including an antenna matching circuit.

BACKGROUND OF THE INVENTION

As antenna matching technology on the aforementioned antenna matching circuit and the like, for example, the following are known.

Patent Document 1 Japanese Patent Application Laid-open No. Hei 5-327331.

A matching means described in Patent Document 1 uses a parallel resonant circuit composed of one L and one C, and it is known as a susceptance compensation method (See paragraph numbers 0006, 0007, FIGS. 2, 4, 6). Patent Document 2 Japanese Patent Application Laid-open No. 2000-286615

A matching means described in Patent Document 2 uses a π-type tuning circuit, and this matching means is also commonly known as an antenna matching means (See a paragraph number 0022, FIG. 4).

Each of the aforementioned documents discloses the technology for integrally fabricating the aforementioned matching means inside a chip antenna, and provides means for integrally matching a monopole, a dipole, or an inverted F type antenna in a chip.

However, according to the aforementioned matching means, a matching property in a chip antenna alone is improved, but performance demanded by a communication device sometimes cannot be covered since the band is not sufficiently widened. Namely, according to the aforementioned Patent Document 1, as shown in FIG. 8 in this document, only a band of 40 MHz with 820 MHz as a center frequency is covered. Concerning a frequency band around 5 GHz in recent years, bands in the vicinity of 4.9 GHz, the vicinity of 5.2 GHz, the vicinity of 5.4 GHz, and the vicinity of 5.8 GHz are used in Japan, the United States, and Europe, respectively. The band of use of the 5 GHz band at the present time is a band of approximately 1 GHz ranging from 4.9 GHz to 5.925 GHz in all countries. If a VSWR of 2 or less is a usable range, as far as the inventors know, there are few antennas relatively small in size and capable of covering the 1-GHz worldwide band at the VWSR of 2 or less.

Hence, the inventors fabricate a chip antenna of the same type as the chip antenna disclosed in Patent Document 2 and conduct an experiment. The chip antenna has dimensions of 8.0×3.0×1.0 mm. As shown in FIG. 21a, a circuit used in the experiment includes an antenna substrate 121, a chip antenna 123 at one end of the antenna substrate, and a GND portion 125 disposed adjacent to the chip antenna 123. The resonant frequency of the chip antenna 123 is set to the 2.5 GHz band, and a length L of the GND portion 125 is set at a length equal to a quarter of a resonant wavelength. As shown by a graphic chart in FIG. 21b, a region with the VSWR of 2 or less (usable region) ranges over 76 MHz from 2410 MHz to 2486 MHz.

Next, if the length L of the GND portion 125 is set at a third of that of the GND portion 125 shown in FIG. 21A as shown in FIG. 22a, the usable region is shifted to higher frequencies as shown in FIG. 22b, whereby the antenna cannot be used due to mismatching in the 2.5 GHz band in which the use of the antenna is required.

Hence, as shown in FIG. 23a, matching is attempted by adding a π-type matching circuit 127 composed of L, C1, and C2 similar to a matching circuit disclosed in Document 2. As a result, it is possible to produce resonance at a desired frequency band, but as shown in FIG. 23b, the region with the VSWR of 2 or less can be secured only in a range of 32 MHz.

As is evident from the aforementioned experiment, when the length of the GND portion is made shorter than a quarter of a wavelength to be used in order to reduce the size, a matching circuit is needed to perform matching at a frequency to be used, but if the r-type circuit is used as this matching circuit, the usable region with the VSWR of 2 or less is secured only in a range of 32 MHz. In order to improve these circumstances, an object of the present invention is to provide antenna matching technology effective in achieving a wider band.

SUMMARY OF THE INVENTION

To attain the aforementioned object, as an antenna band widening means according to the present invention, a parallel resonant matching circuit including a series resonant portion is proposed. Unlike a susceptance compensation method of performing matching by a parallel resonant circuit described in the aforementioned Patent Document 1 and a π-type matching circuit described in the aforementioned Patent Document 2, this matching means is effective as a means for obtaining a wider band.

An important point of this means is that the series resonant portion is composed of an inductance component and a capacitance component which are independent of each other, which produces an excellent effect which cannot be obtained by series resonance caused by a parasitic inductance which occurs on the capacitance side of the parallel resonant circuit in Patent Document 1.

Namely, in the present invention, a distributed constant type equivalent inductance or a lumped constant type inductance, for example, is formed on a dielectric substrate to intentionally constitute the series resonant portion. It can be confirmed that such a constitution makes it possible to obtain more than twice the band in the parallel resonant means in Patent Document 1.

Regardless of whether this matching means is formed inside a chip antenna or not, this matching means is applicable also when provided as a matching circuit outside the chip antenna, and regardless of the type of an antenna such as a monopole, a dipole, or an inverted L type, and besides regardless of whether these antennas are formed in a meander shape or element tips are bended, this matching means is widely applicable. The provision of a stub and adoption of an array antenna do not hinder the adoption of this matching means.

DETAILED DESCRIPTION OF THE PREFERRED EMBODIMENT(S)

Figure 7:
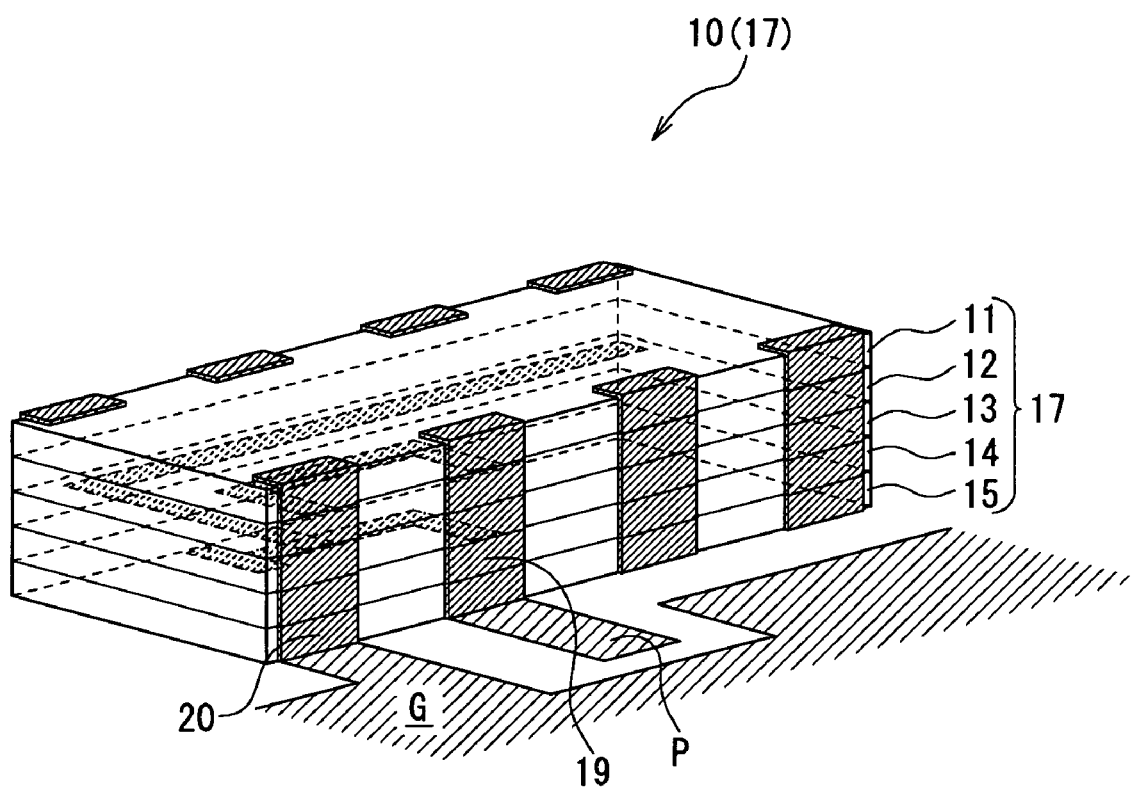
FIG. 7 is perspective view of a dielectric antenna.
Figure 8:
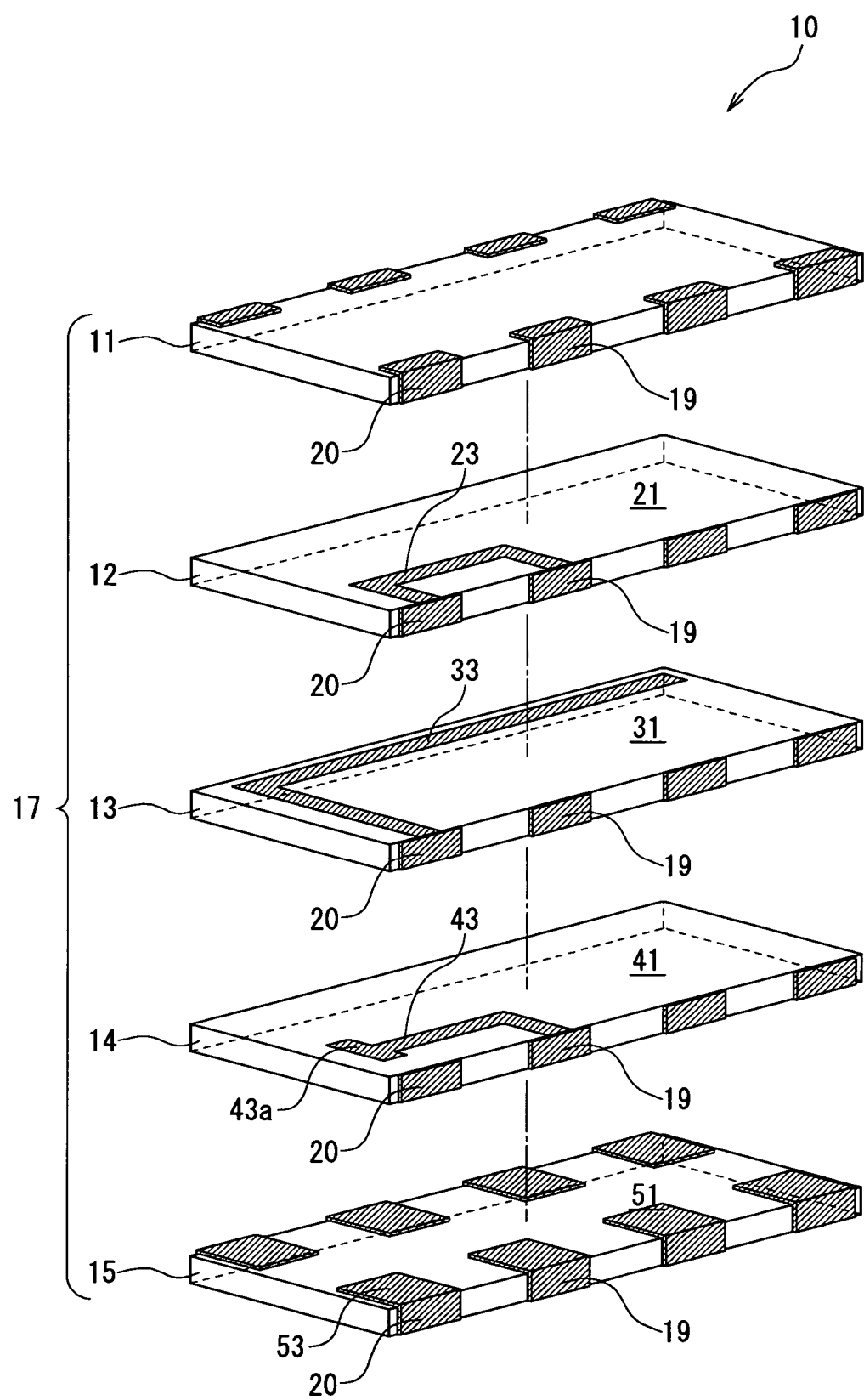
FIG. 8 is an exploded perspective view of the dielectric antenna shown in FIG. 7.
Figure 9A:
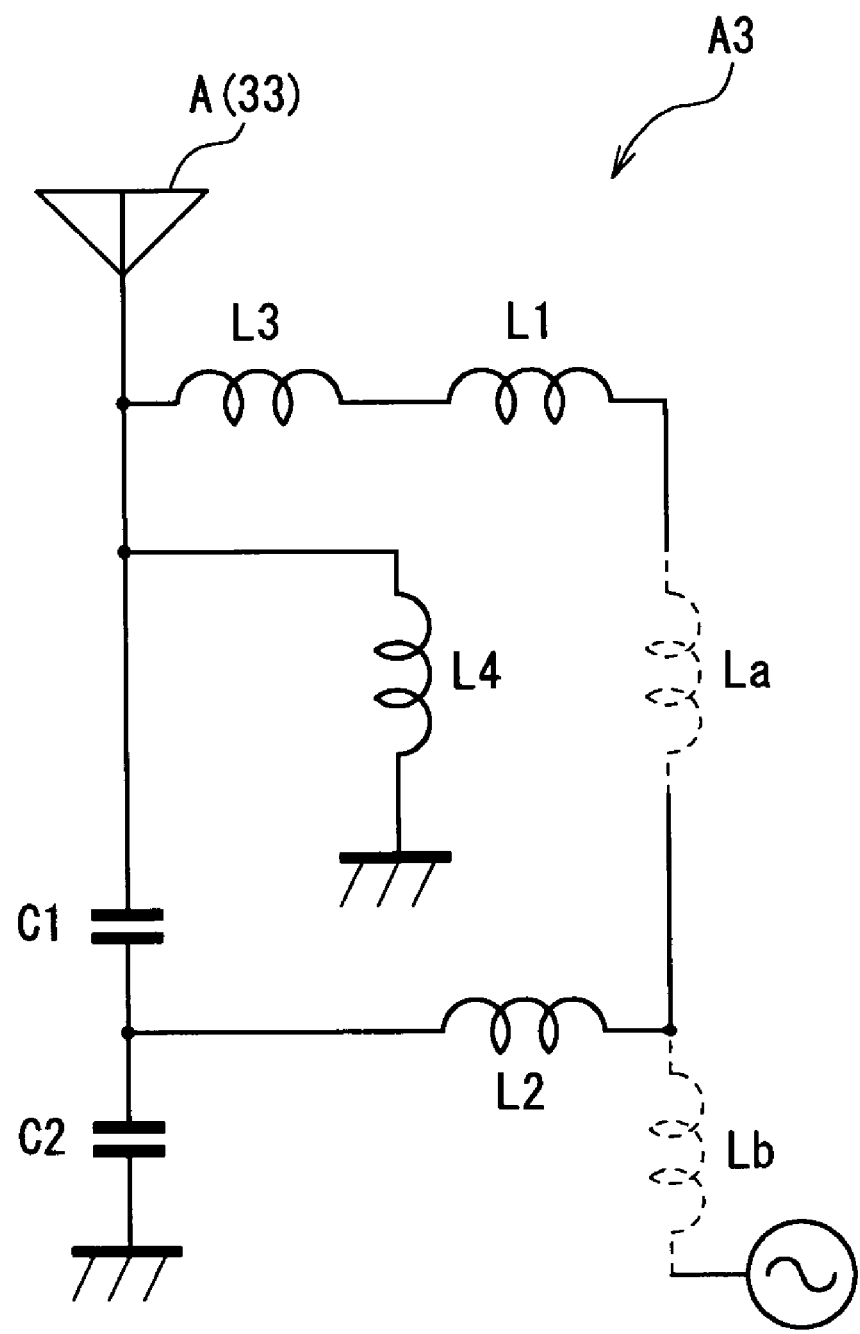
FIG. 9a and FIG. 9b are an exploded plane view and an equivalent circuit diagram, respectively, in which a first substrate of the dielectric antenna shown in FIG. 7 is omitted.
Figure 9B:
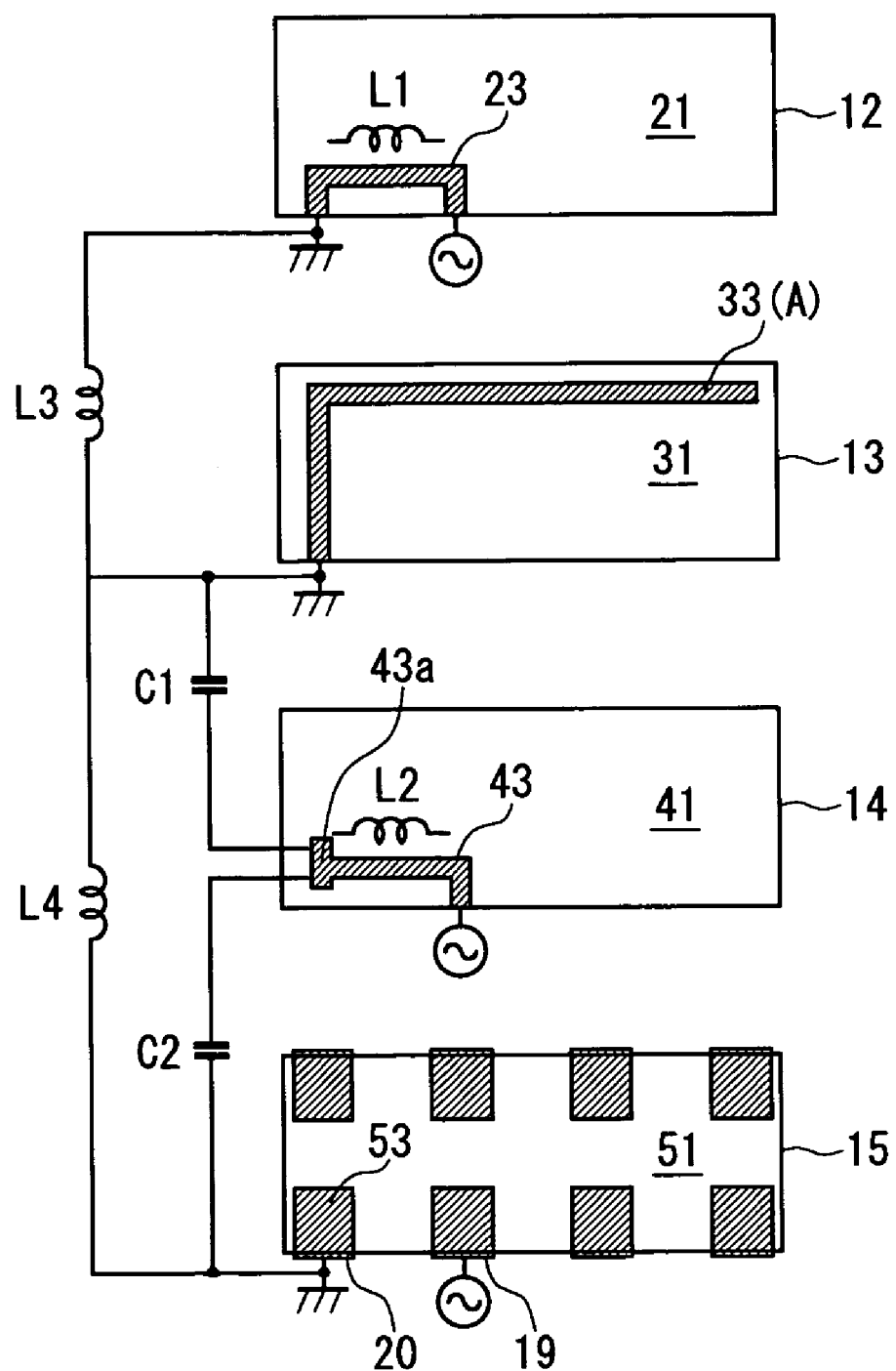
Figure 10:
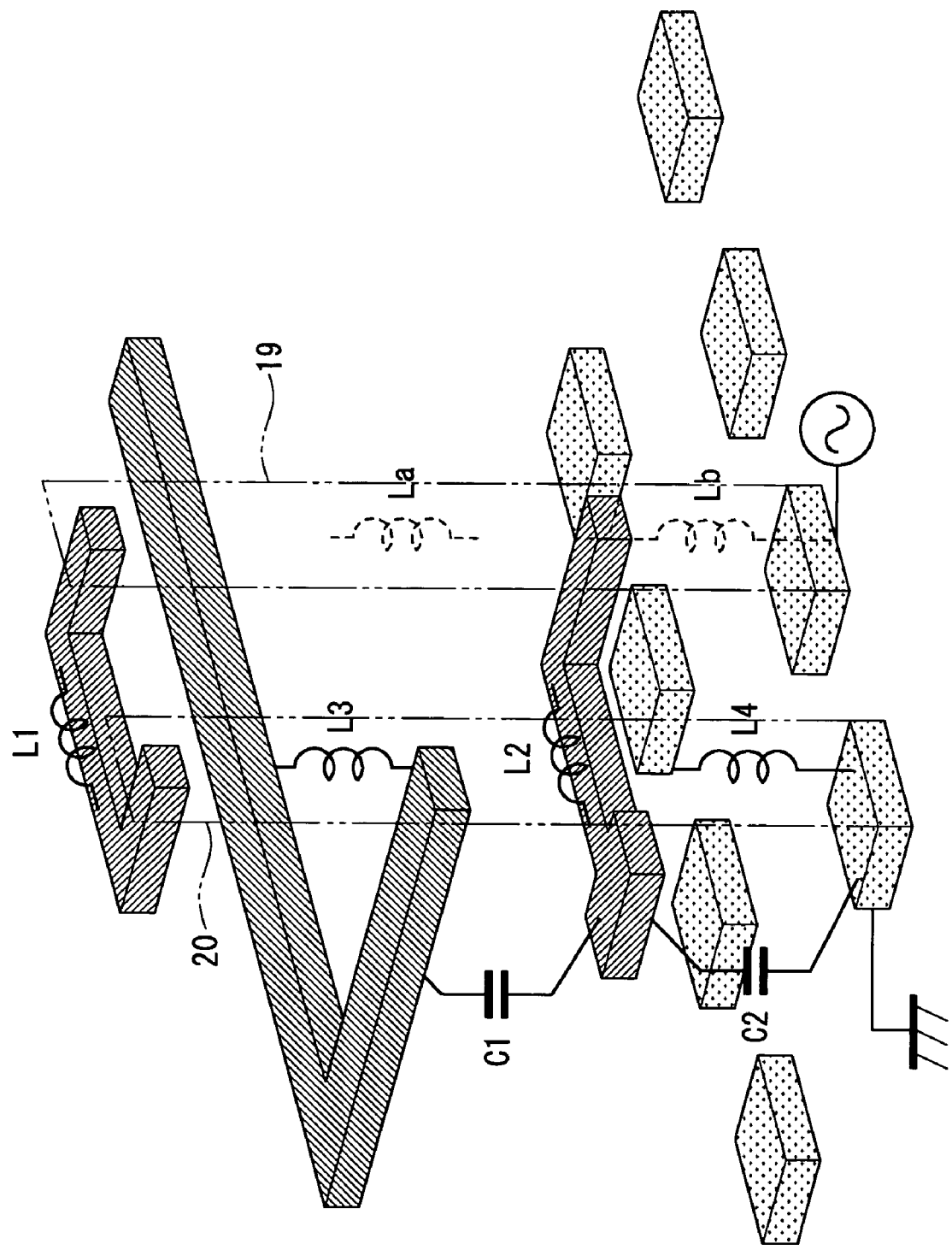
FIG. 10 is a schematic perspective view showing interrelations among elements of the dielectric antenna shown in FIG. 7.
Figure 11:
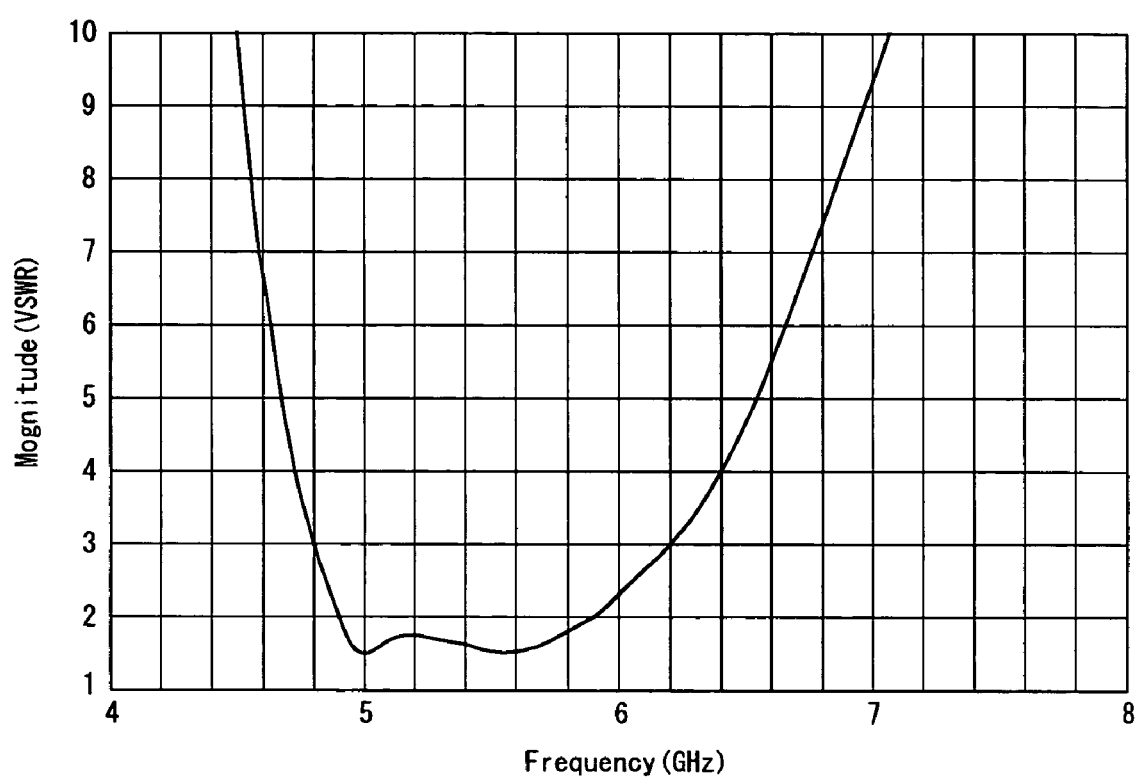
FIG. 11 is a graphic chart representing VSWR characteristics of the dielectric antenna shown in FIG. 7.
Figure 12:
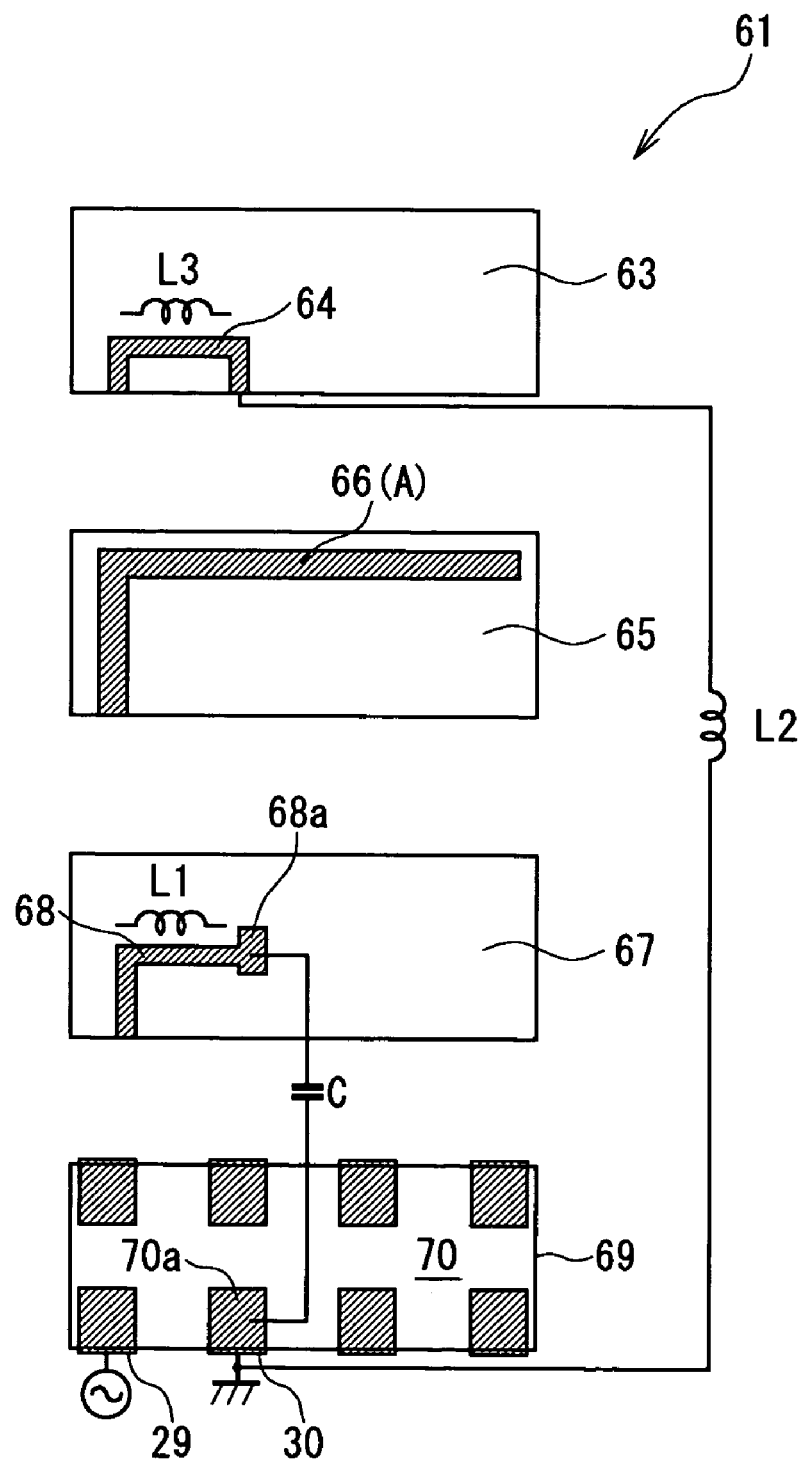
FIG. 12 is an exploded plane view showing a dielectric antenna according to a first modification example of this embodiment.
Figure 13:
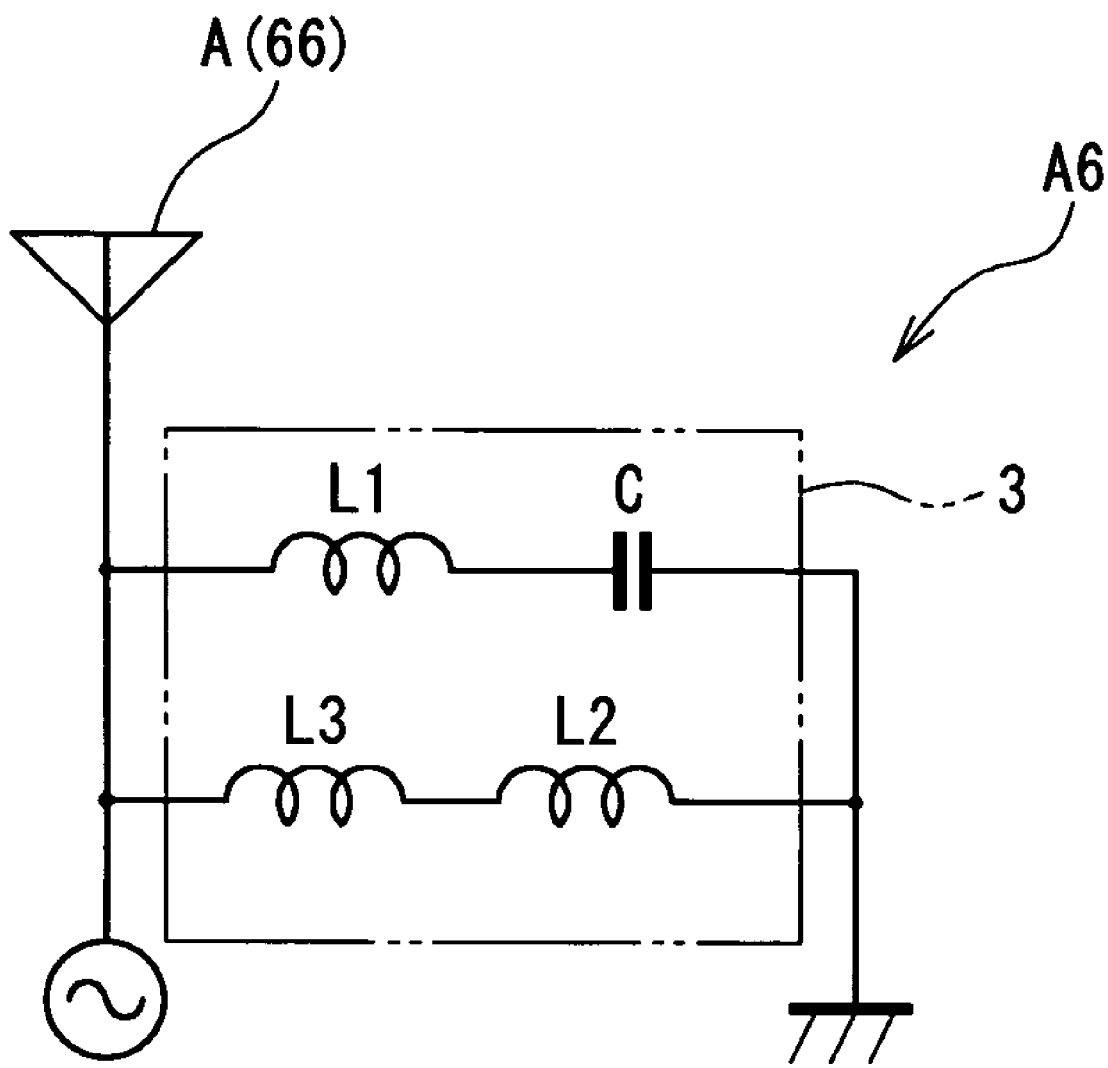
FIG. 13 is an equivalent circuit diagram of the dielectric antenna shown in FIG. 12.
Figure 14:
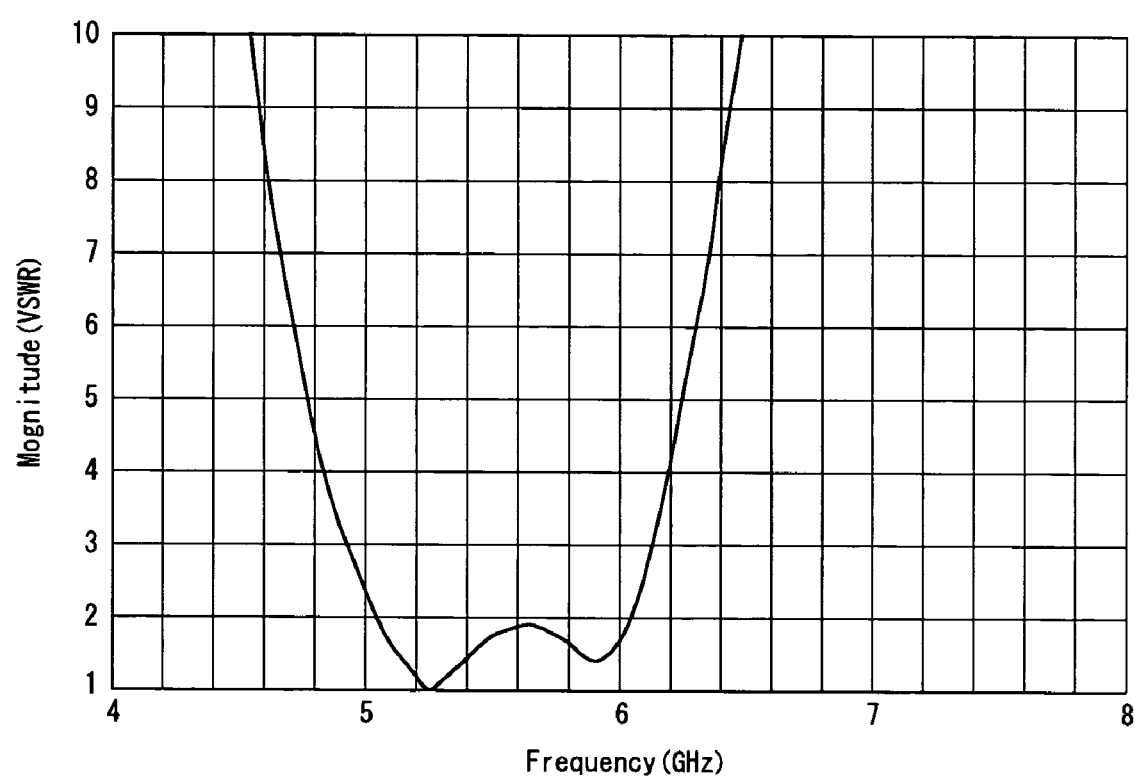
FIG. 14 is a graphic chart representing VSWR characteristics of the dielectric antenna shown in FIG. 12.
Figure 15A:
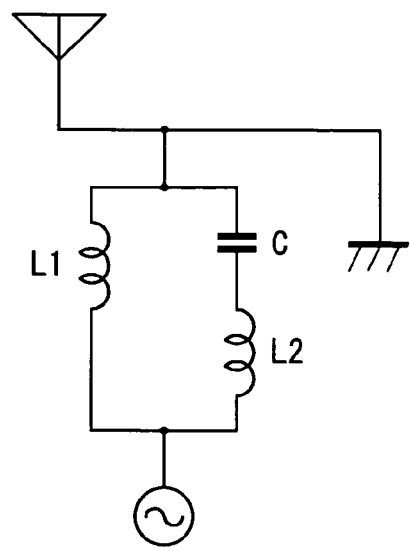
FIG. 15a, and FIG. 15b and FIG. 15c are an equivalent circuit diagram and exploded plane views, respectively, showing a dielectric antenna according to a second modification example of this embodiment.
Figure 15B:
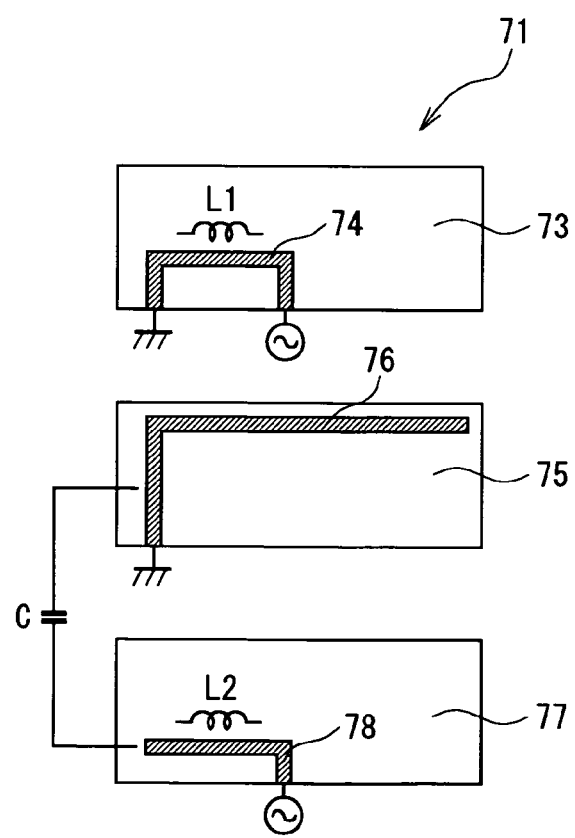
Figure 15C:
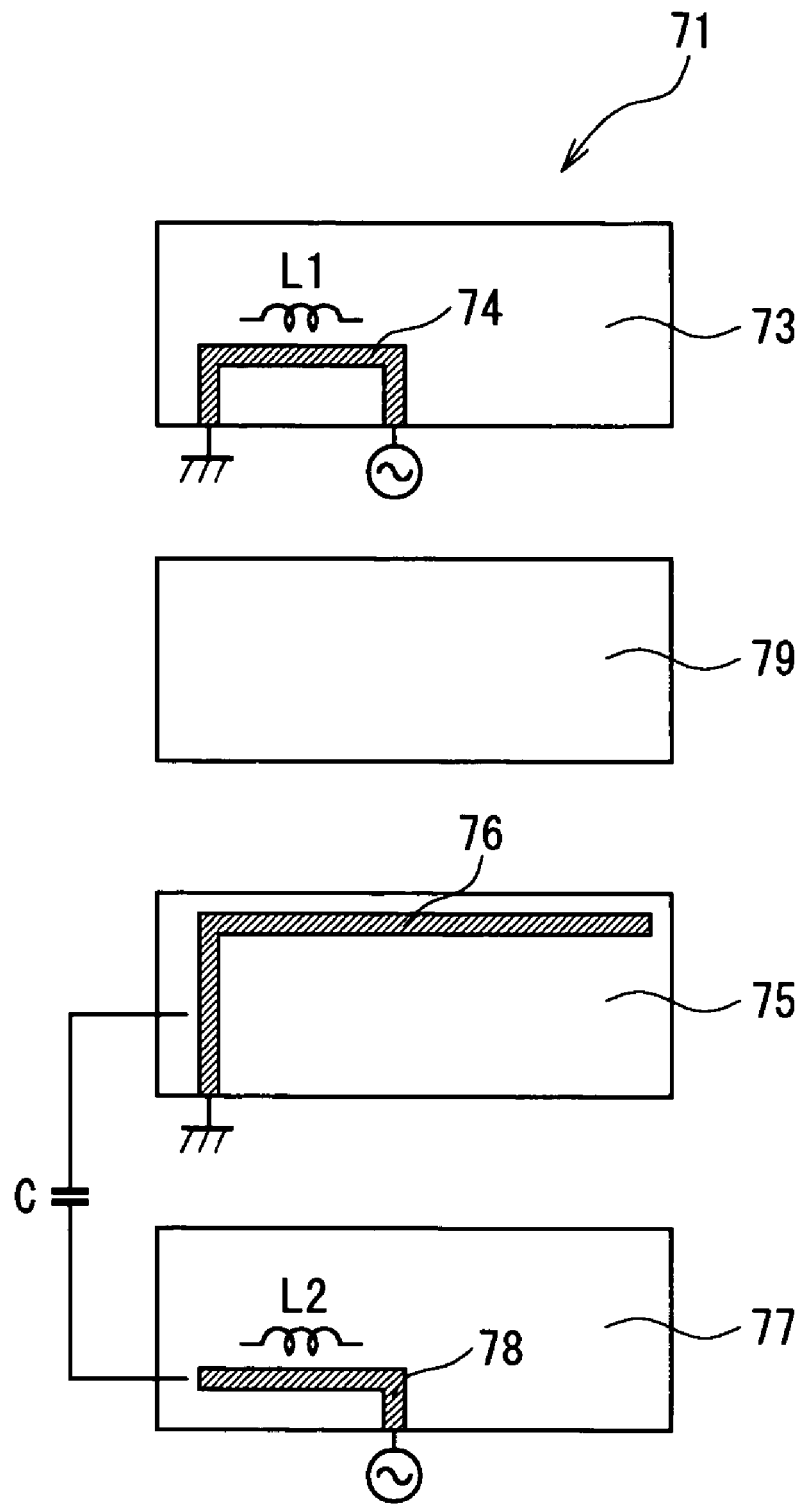
Figure 16:
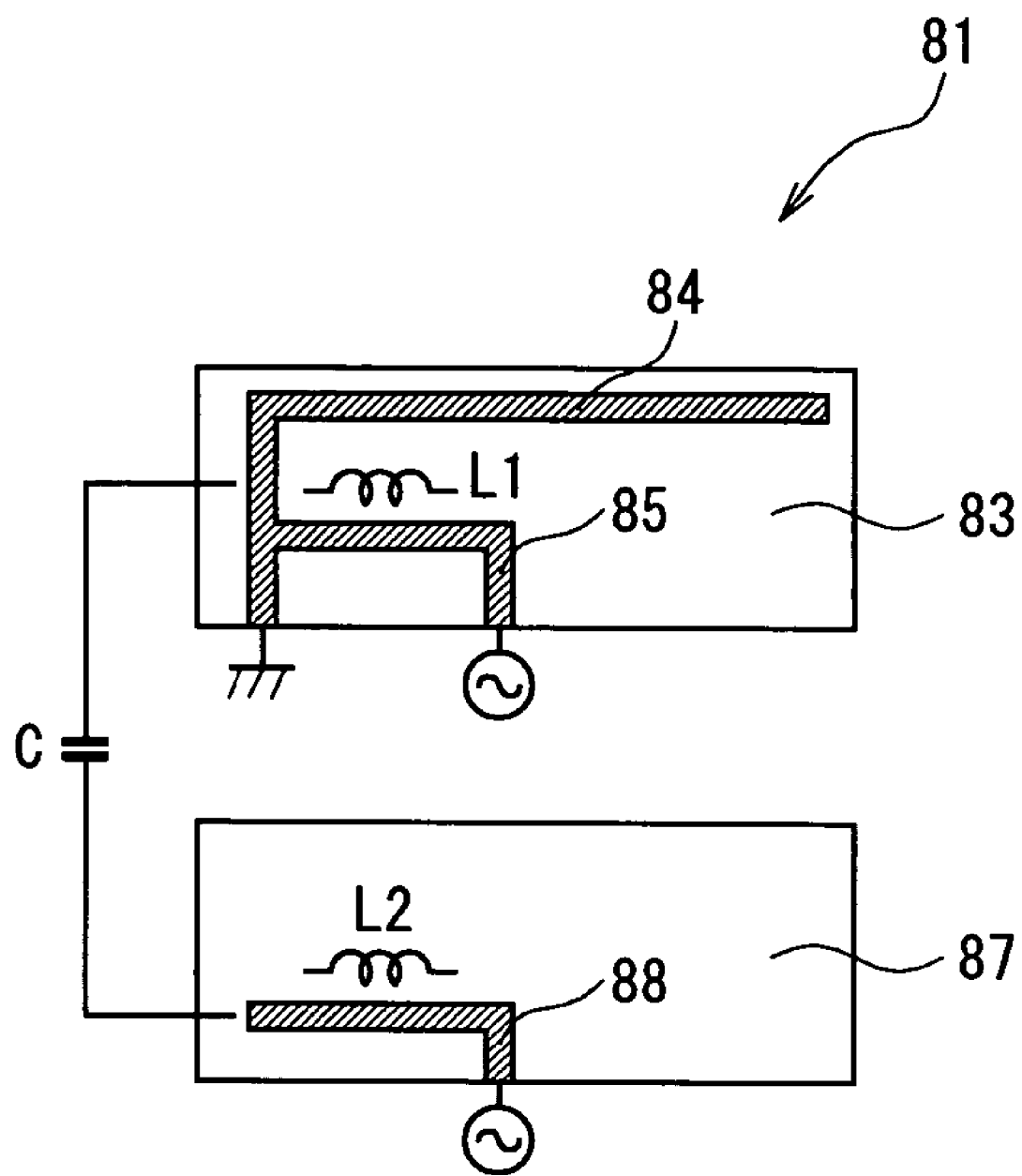
FIG. 16 is an exploded plane view showing a dielectric antenna according to a third modification example of this embodiment.
Figure 17A:
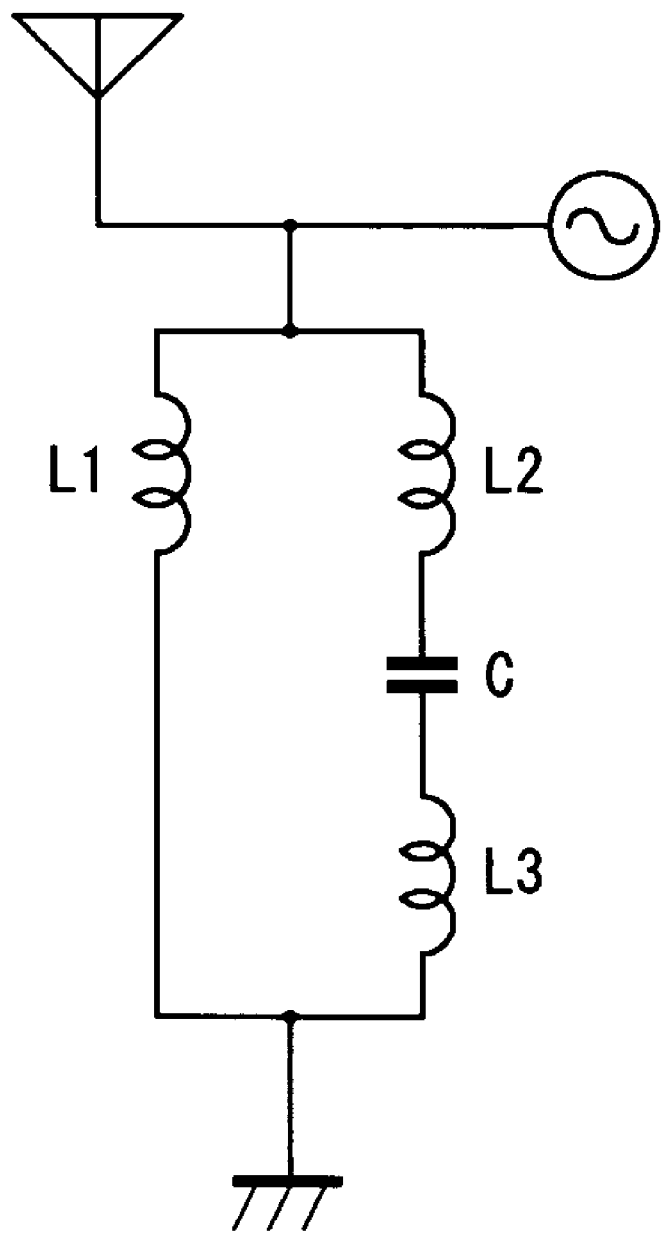
FIG. 17a and FIG. 17b are an equivalent circuit diagram and an exploded plane view, respectively, showing a dielectric antenna according to a fourth modification example of this embodiment.
Figure 17B:
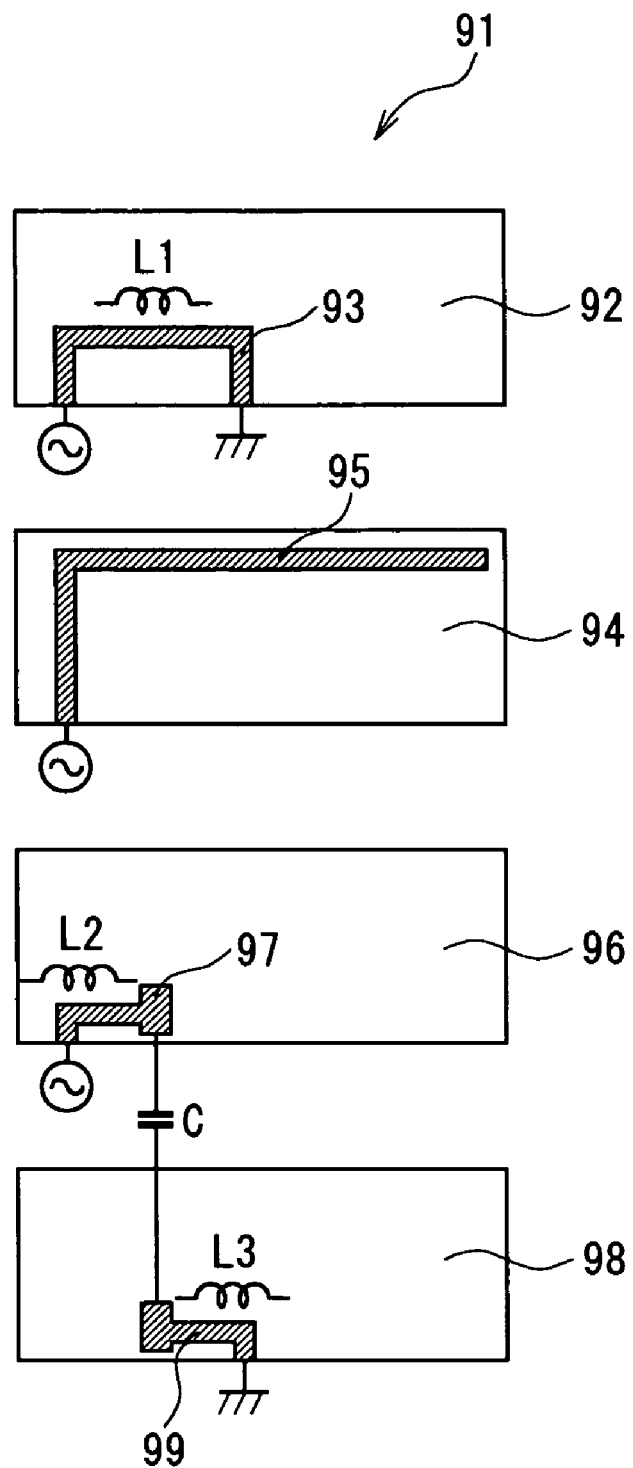
Figure 18A:
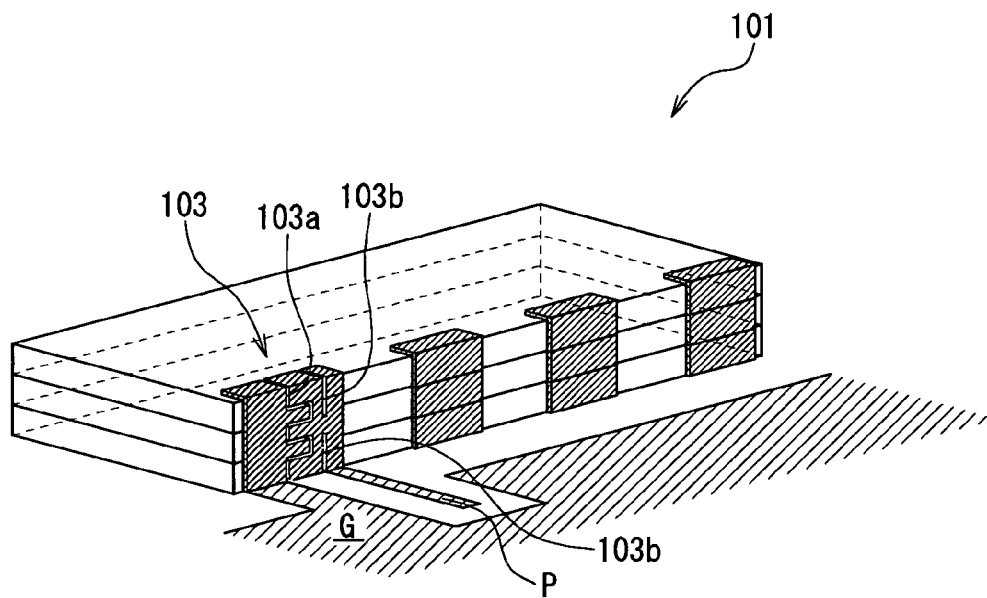
FIG. 18a and FIG. 18b are a perspective view and an equivalent circuit diagram, respectively, of a dielectric antenna for a comparative experiment.
Figure 18B:
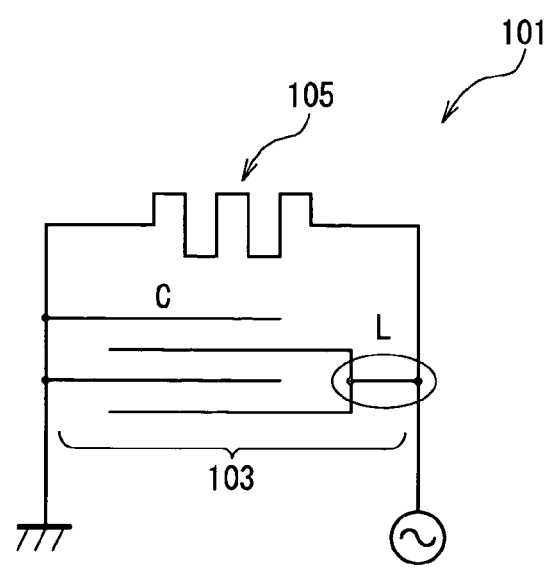
Figure 19A:
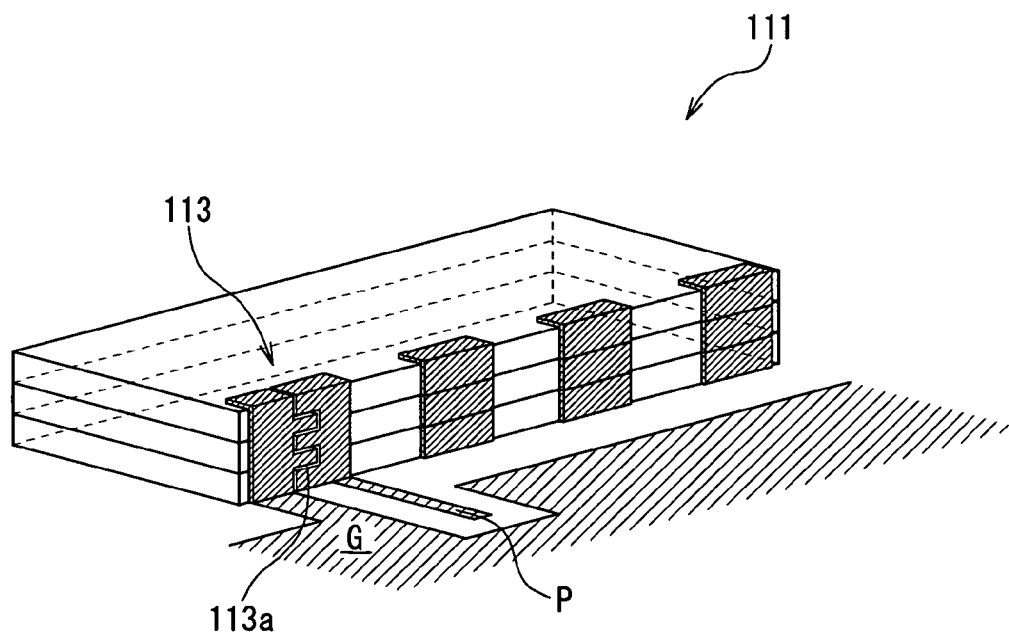
FIG. 19a and FIG. 19b are a perspective view and an equivalent circuit diagram, respectively, of a dielectric antenna as a comparison object.
Figure 19B:
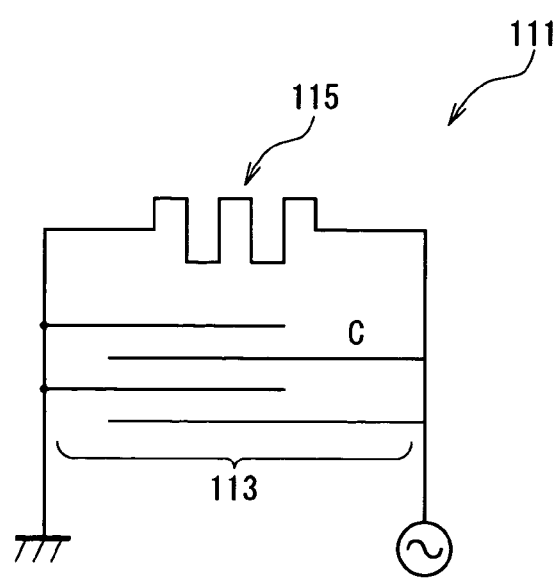
Figure 20:
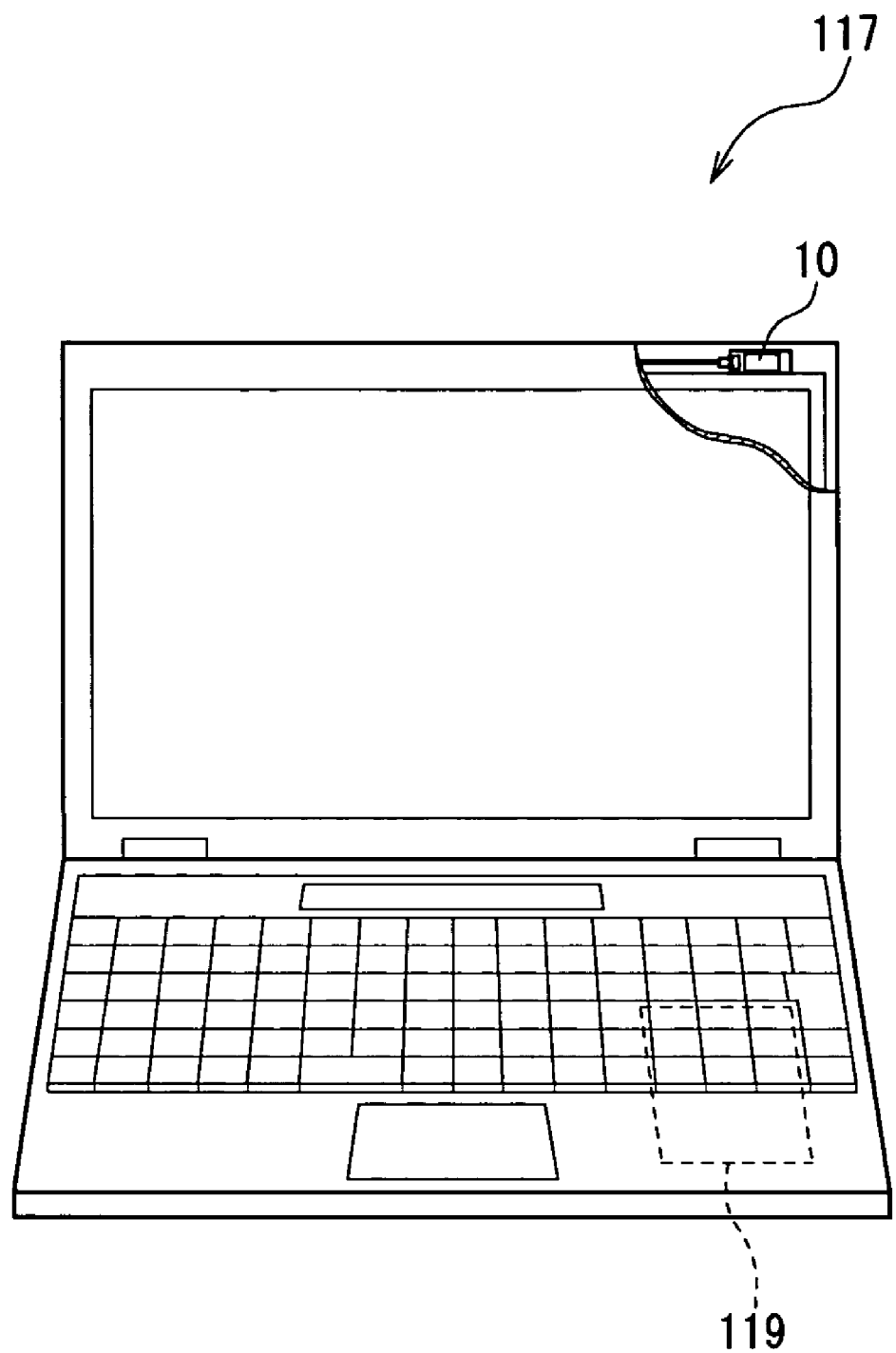
FIG. 20 is a front view of a personal computer which is a communication device.
Figure 21A:
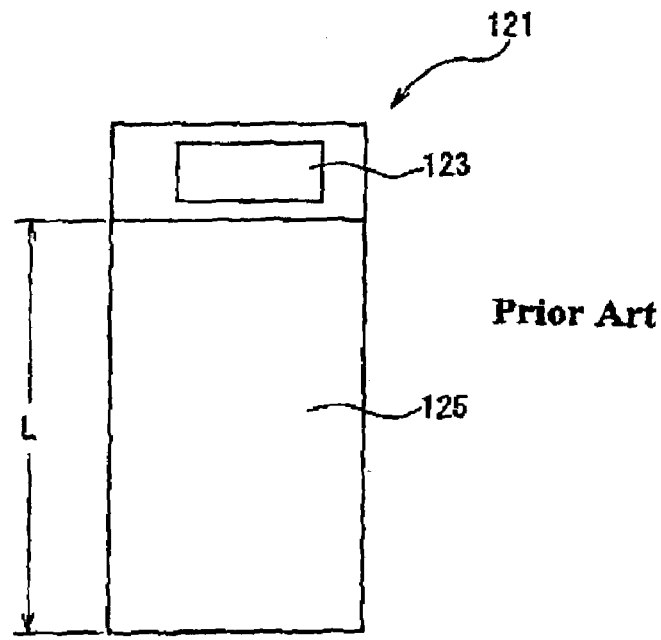
FIG. 21a and FIG. 21b are a plane view and a VSWR characteristics chart, respectively, of a conventional chip antenna.
Figure 21B:
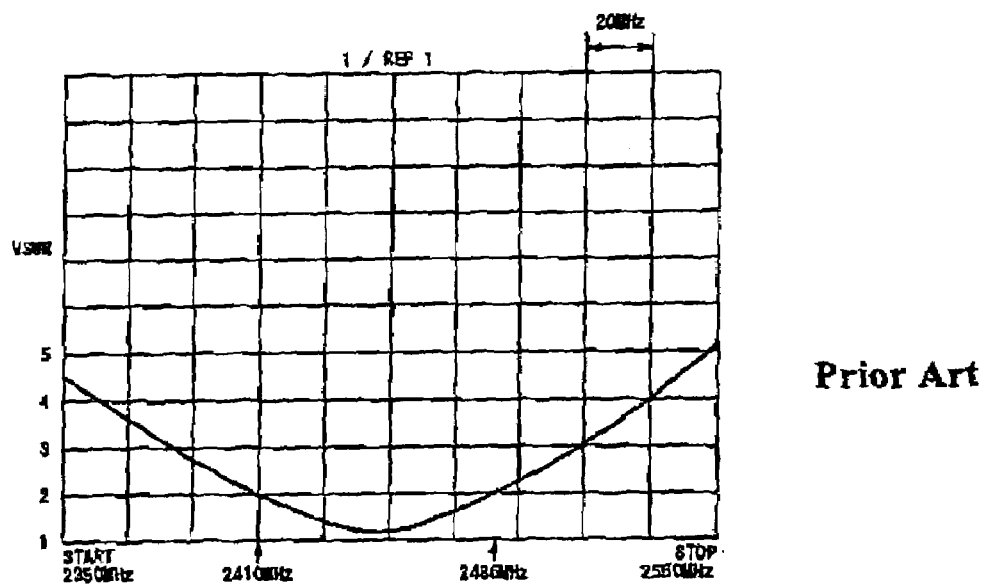
Figure 22A:
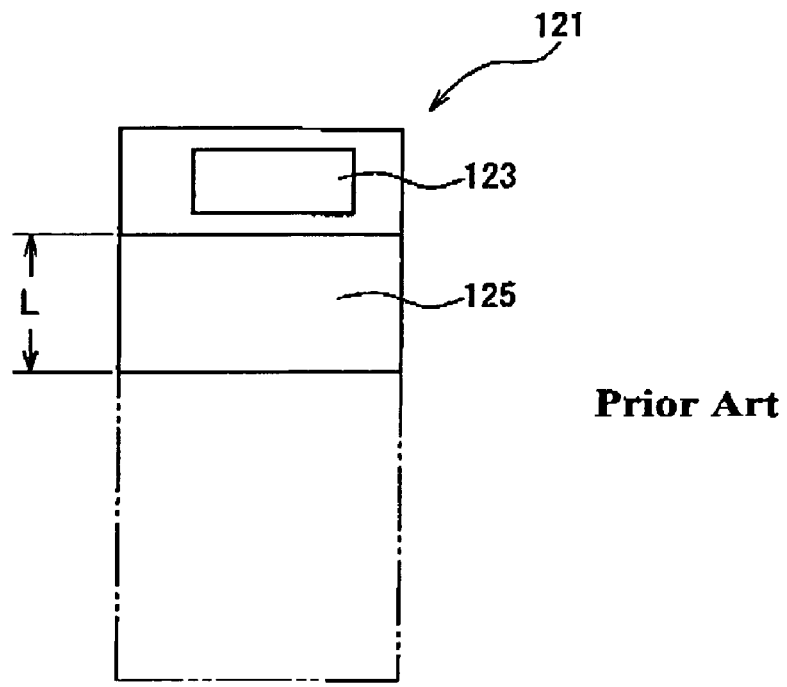
FIG. 22a and FIG. 22b are a plane view and a VSWR characteristics chart, respectively, of a conventional chip antenna.
Figure 22B:
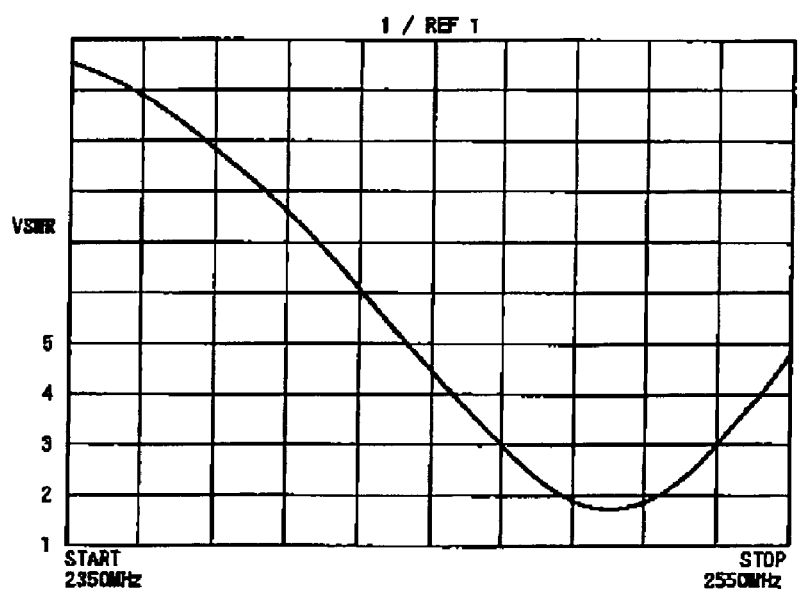
Figure 23A:
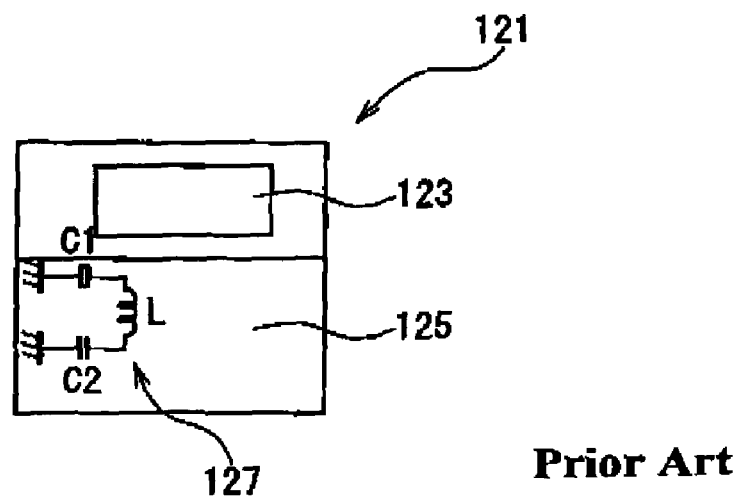
FIG. 23a and FIG. 23b are a plane view and a VSWR characteristics chart, respectively, of a conventional chip antenna.
Figure 23B:
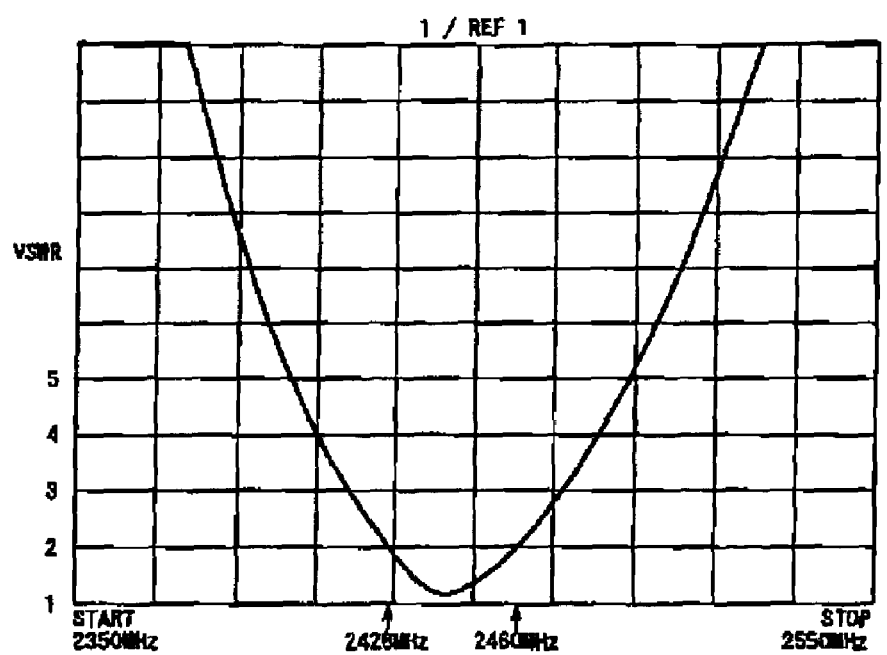

An embodiment of the present invention will be described in detail below with reference to the drawings. FIG. 1 to FIG. 6 are circuit diagrams showing forms in each of which the present invention is applied to a matching circuit. FIG. 7 is a perspective view of a dielectric antenna. FIG. 8 is an exploded perspective view of the dielectric antenna shown in FIG. 7. FIG. 9a and FIG. 9b are an exploded plane view and an equivalent circuit diagram, respectively, in which a first substrate of the dielectric antenna shown in FIG. 7 is omitted. FIG. 10 is a schematic perspective view showing interrelations among elements of the dielectric antenna shown in FIG. 7. FIG. 11 is a graphic chart representing VSWR characteristics of the dielectric antenna shown in FIG. 7. FIG. 12 is an exploded plane view showing a dielectric antenna according to a first modification example of this embodiment. FIG. 13 is an equivalent circuit diagram of the dielectric antenna shown in FIG. 12. FIG. 14 is a graphic chart representing VSWR characteristics of the dielectric antenna shown in FIG. 12. FIG. 15a, and FIG. 15b and FIG. 15c are an equivalent circuit diagram and exploded plane views, respectively, showing a dielectric antenna according to a second modification example of this embodiment. FIG. 16 is an exploded plane view showing a dielectric antenna according to a third modification example of this embodiment. FIG. 17a and FIG. 17b are an equivalent circuit diagram and an exploded plane view, respectively, showing a dielectric antenna according to a fourth modification example of this embodiment. FIG. 18a and FIG. 18b are a perspective view and an equivalent circuit diagram, respectively, of a dielectric antenna for a comparative experiment. FIG. 19a and FIG. 19b are a perspective view and an equivalent circuit diagram, respectively, of a dielectric antenna as a comparison object. FIG. 20 is a front view of a personal computer which is a communication device.

(Structure of Antenna Matching Circuit)

Figure 1:
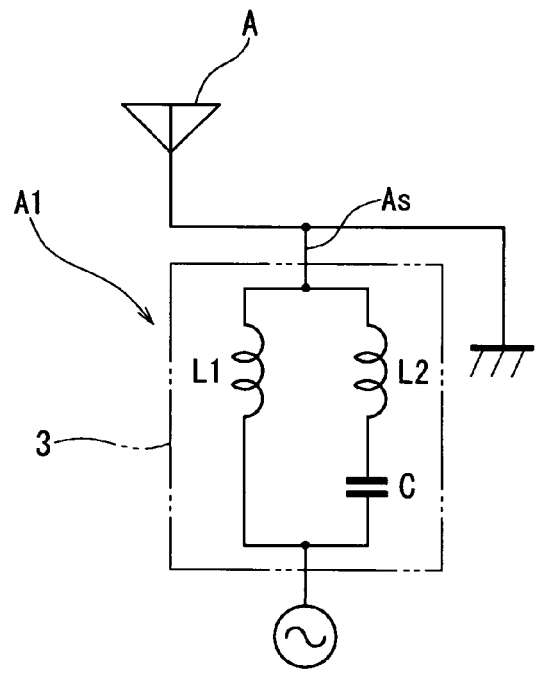
FIG. 1 is a circuit diagram showing a form in which the present invention is applied to a matching circuit.

An explanation will be given based on FIG. 1 to FIG. 6. An antenna matching circuit A1 shown in FIG. 1 is connected to an antenna (radiation element) A and includes a parallel resonant section 3. An inductance component L1 is connected to one side of the parallel resonant section 3, and an inductance component L2 and a capacitance component C which are connected in series are connected to the other side thereof. The antenna matching circuit A1 is an example of a case where the matching circuit according to the present invention is inserted in a feeder line, and it can be confirmed that a band of 1 GHz is obtained at a center frequency of 5 GHz by this configuration. The antenna A is a so-called inverted F type antenna, and the antenna matching circuit A1 is provided in the middle of a short end As of the antenna A. When the antenna matching circuit A1 is applied to antennas other than the inverted F type antenna, for example, a monopole antenna (not shown), it can be connected to other positions appropriately.

Figure 2:
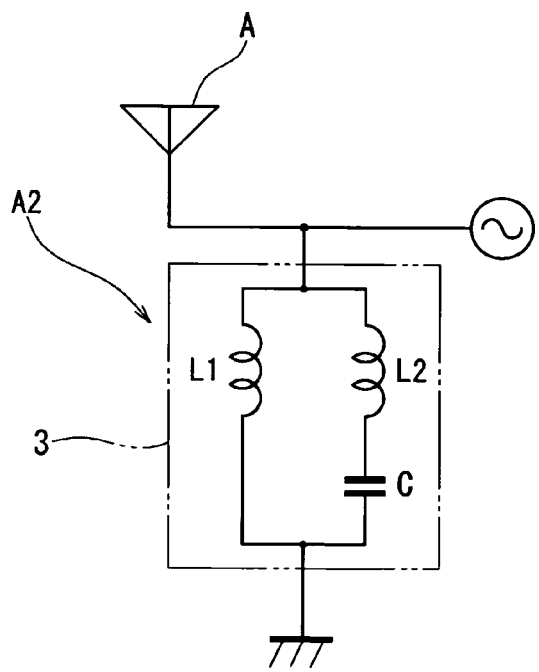
FIG. 2 is a circuit diagram showing a form in which the present invention is applied to a matching circuit.

An antenna matching circuit A2 shown in FIG. 2 is a circuit similar to the aforementioned antenna matching circuit A1, but they are different in that the latter is provided in the feeder line, whereas the former is provided in a GND line. Also in the antenna matching circuit A2, as in the antenna matching circuit A1, a band of approximately 1 GHz can be obtained at a center frequency of 5 GHz.

Figure 3:
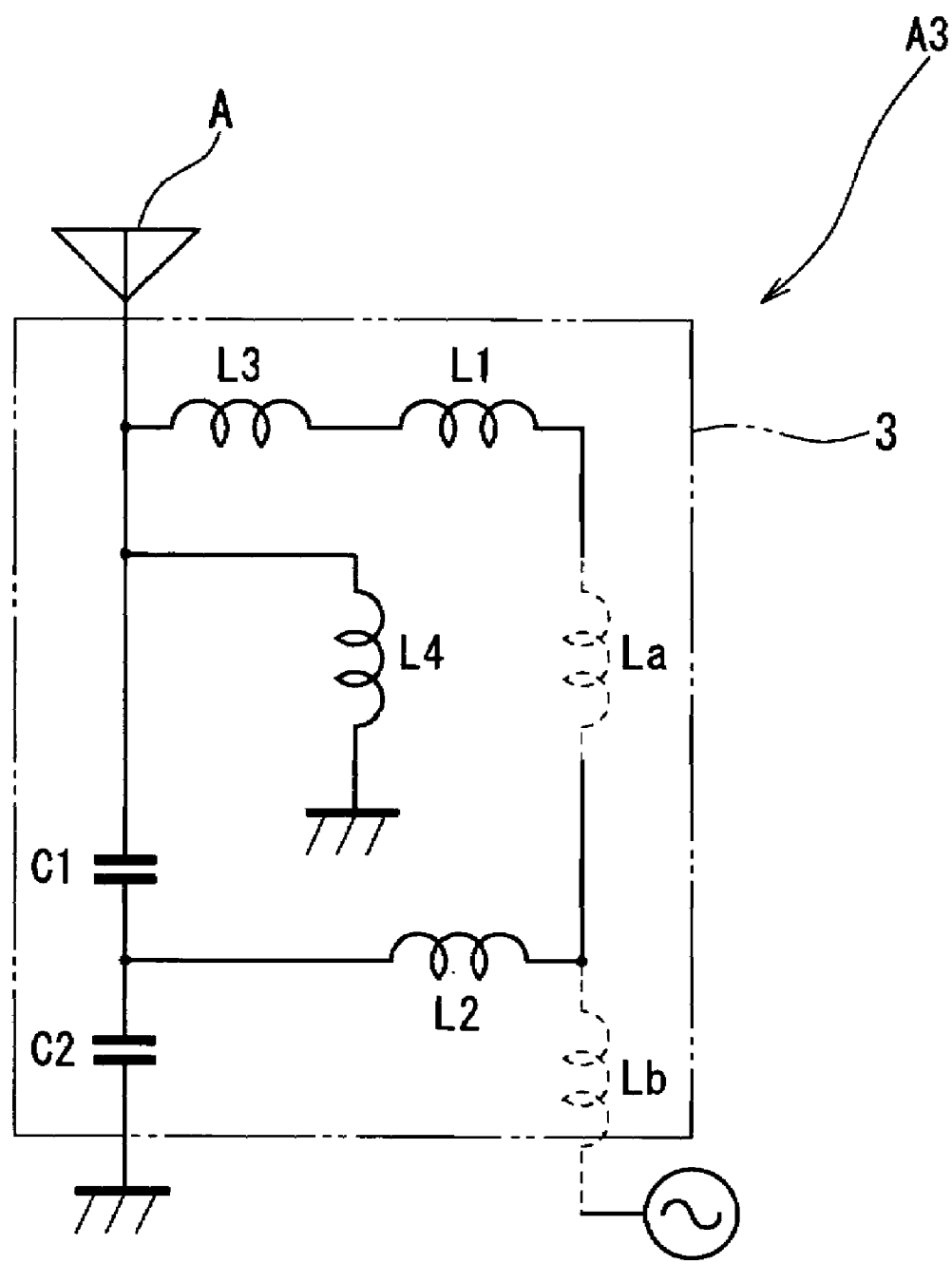
FIG. 3 is a circuit diagram showing a form in which the present invention is applied to a matching circuit.

As an antenna matching circuit A3 shown in FIG. 3 shows, in the present invention, if a parallel resonant circuit including a series resonant portion is provided, the effect of widening the band can be practically expected even if an inductance component and a capacitance component additionally occur. Namely, the parallel resonant section 3 included in the antenna matching circuit A3 is composed of an inductance component L1 and an inductance component L3 which are connected in series, and an inductance component L2 and a capacitance component C1 which are connected in series. Components other than the aforementioned components constituting the parallel resonant circuit, such as an inductance component L4 and a capacitance component C2, may be included. The resonant frequency is set at a relatively high frequency band of 5 GHz band in this embodiment, hence parasitic inductances La and Lb, and the like sometimes occur depending on circuit structure, and by performing structural design in which these parasitic inductances are reflected, it is possible to widen the band of the antenna.

Figure 4:
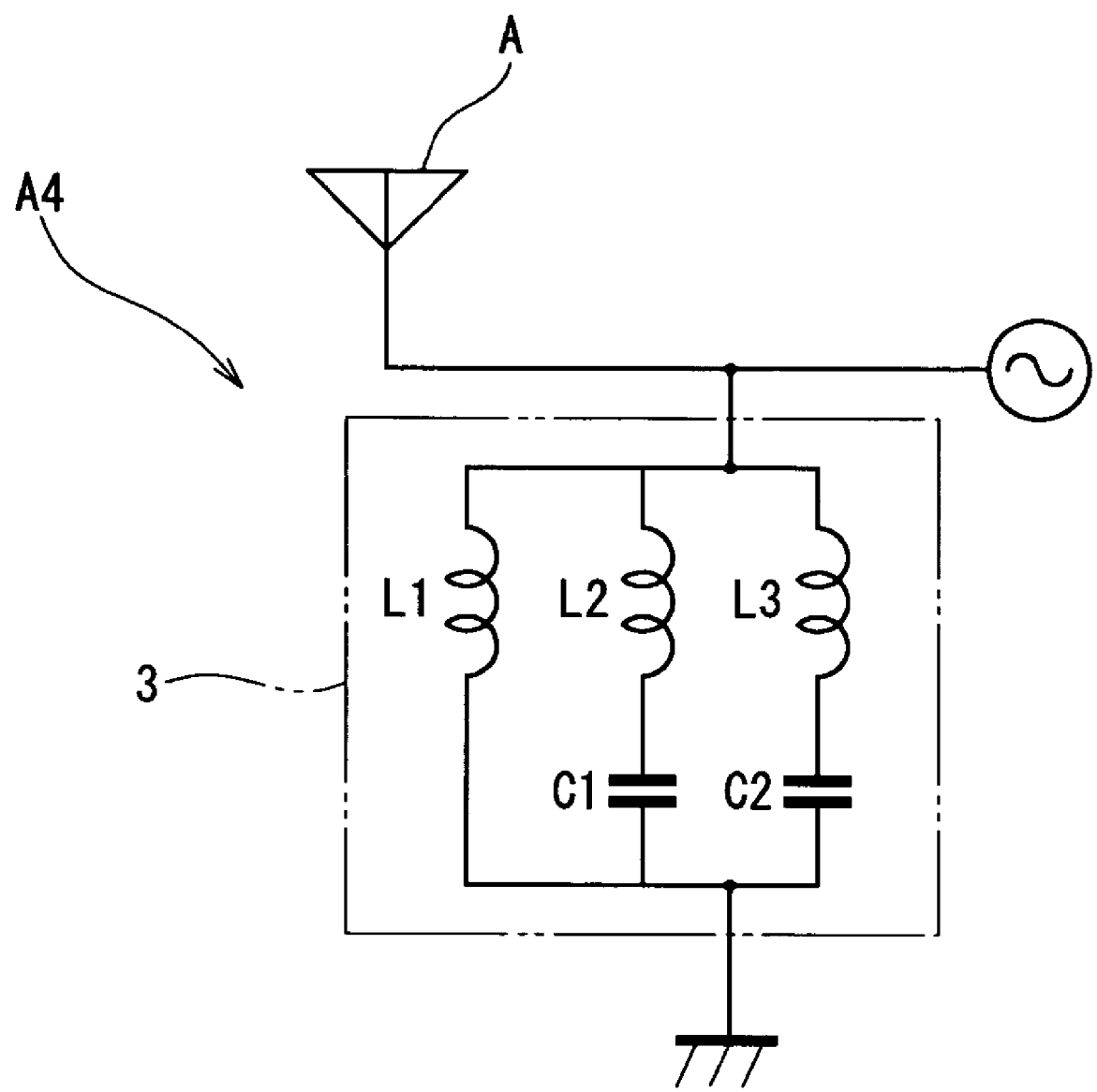
FIG. 4 is a circuit diagram showing a form in which the present invention is applied to a matching circuit.

An antenna matching circuit A4 shown in FIG. 4 is an example in which one series resonant portion is further added to the aforementioned antenna matching circuit A2. Namely, an inductance component L1, an inductance component L2 and a capacitance component C1 which are connected in series, and an inductance component L3 and a capacitance component C2 which are connected in series are connected in parallel. Although not shown, another inductance component and another capacitance component which are connected in series may be further connected in parallel. It is within the scope of the present invention to provide plural series resonant portions as described just above.

Figure 5:
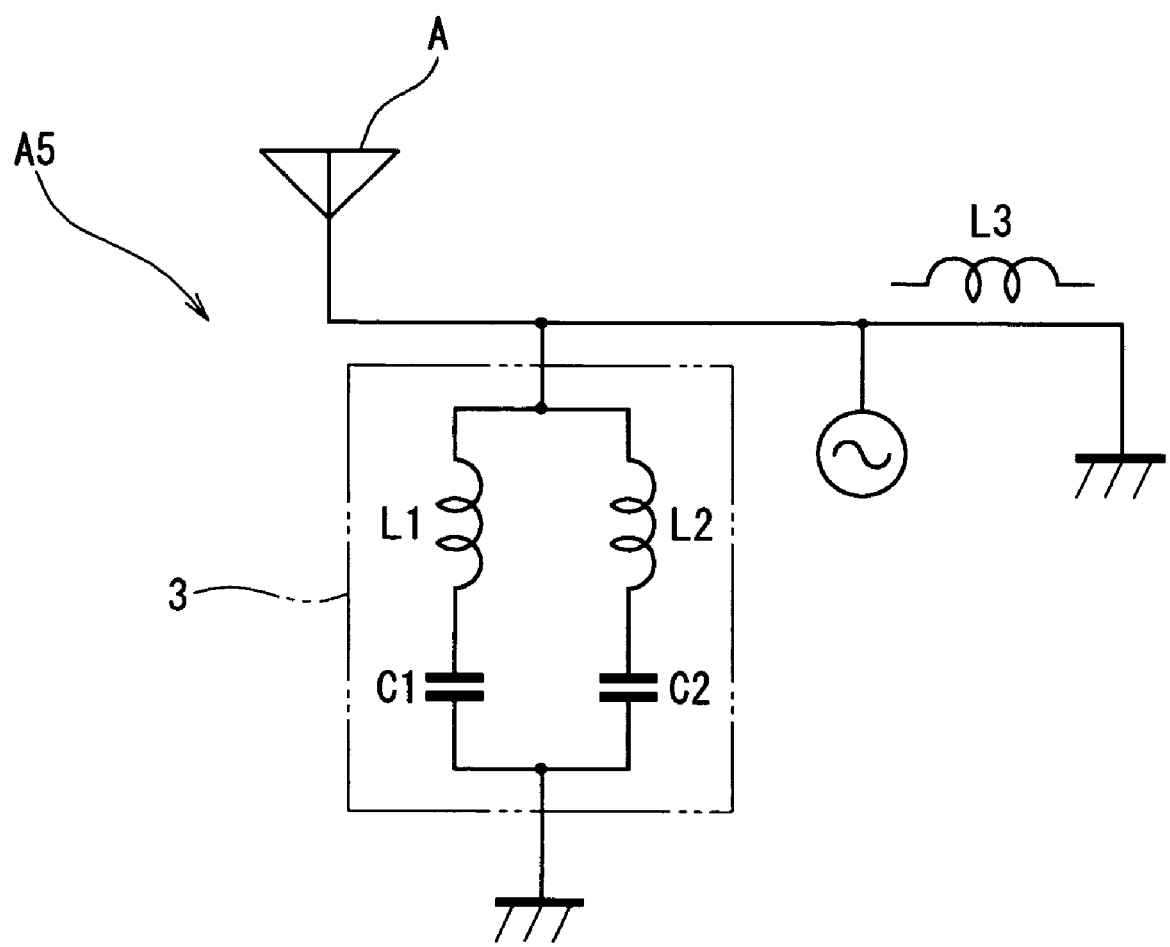
FIG. 5 is a circuit diagram showing a form in which the present invention is applied to a matching circuit.

An antenna matching circuit shown in FIG. 5 is an example of a case where a parallel resonant matching circuit is composed of two series resonant portions and an independent inductance component. Namely, an inductance component L1 and a capacitance component C1 which are connected in series, and an inductance component L2 and a capacitance component C2 which are also connected in series are connected in parallel, and an inductance component L3 is further connected in parallel with these components. The inductance component L3 is replaced with an inductance component included in a matching element of the antenna A which is an inverted F type antenna. Although not shown, another inductance component and another capacitance component which are connected in series may be further connected in parallel, and together with this or in place of this, another inductance component or another capacitance component may be connected in parallel. Such a configuration that plural series resonant portions are connected in parallel is also within the scope of the present invention.

Although not shown, such a configuration that a technical idea of the antenna matching circuit A4 or the antenna matching circuit A5 is realized in a feeder line as in the case of the antenna matching circuit A1 is also within the scope of the present invention.

Figure 6:
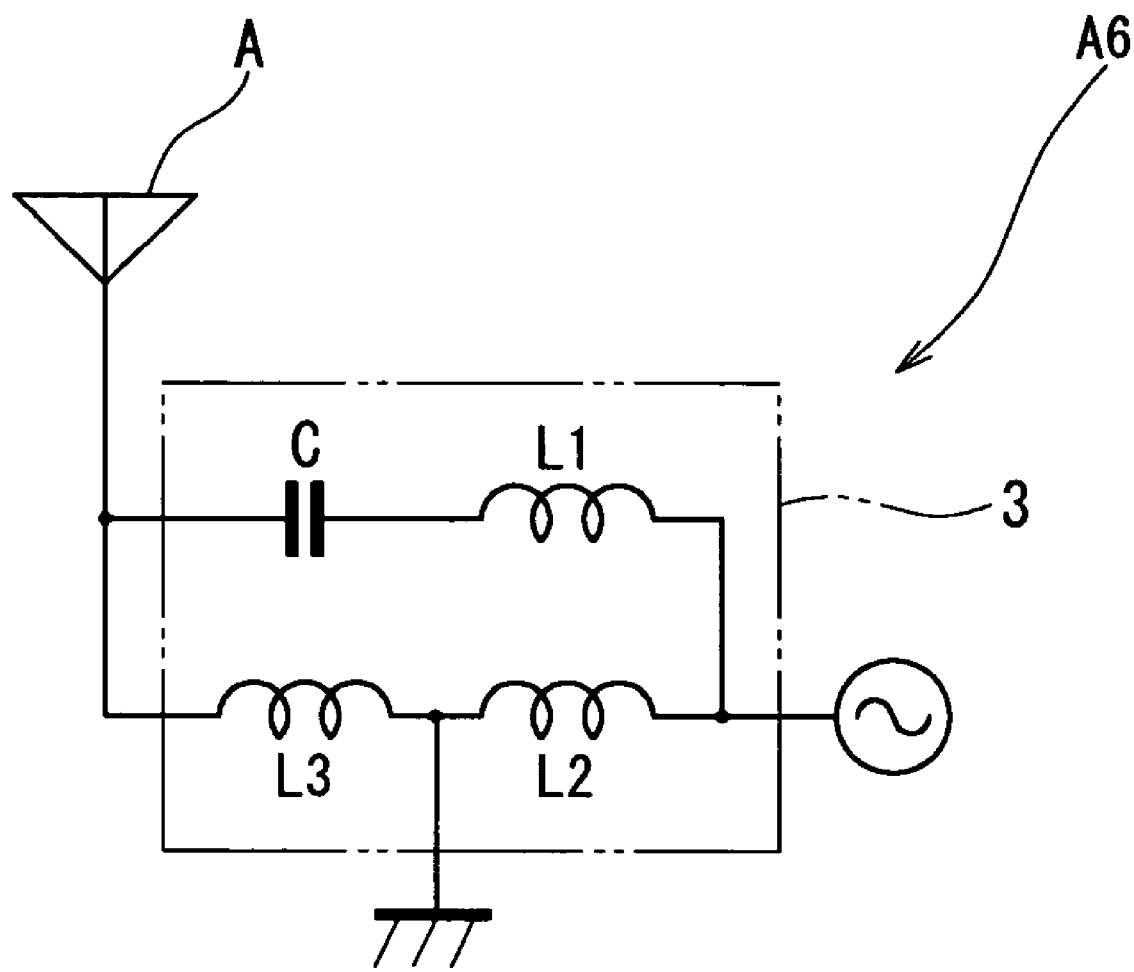
FIG. 6 is a circuit diagram showing a form in which the present invention is applied to a matching circuit.

As shown in FIG. 6, an antenna matching circuit A6 is an example of a case where a matching section according to the present invention spans both a feeder line and a GND line. Namely, a parallel resonant section 3 of the antenna matching circuit A6 is composed of an inductance component L1 and a capacitance component C which are connected in series on one side and an inductance component L2 and an inductance component L3 which are connected on the other side. Such a configuration is also possible.

(Structure of Dielectric Antenna)

A dielectric antenna 10 including a radiation element and an antenna matching circuit as described later will be explained based on FIG. 7 and FIG. 8. The dielectric antenna 10 is formed by layering insulating substrates each made of a dielectric ceramic material, and includes a dielectric base 17 composed of five layers of a first substrate 11, a second substrate 12, a third substrate 13, a fourth substrate 14, and a fifth substrate 15 in order from the top down. Each of the substrates 11, 12, 13, 14, and 15 shown in FIG. 7 and FIG. 8 is represented by a single layer, but each substrate itself may be structured by layering thin substrates. Moreover, the thickness of each substrate may be different from that shown in the figures. All of the substrates 11, 12, 13, 14, and 15 are formed in a rectangle (quadrangle) having the same size when seen in plane view, and hence the dielectric base 17 formed by layering these substrates has a rectangular parallelepiped shape. Since there is no obstacle to the formation of the dielectric base 17 in shapes other than the rectangular parallelepiped shape, it is possible to form the dielectric base 17 in some other shape. An upper surface of the second substrate 12 (a surface facing a lower surface of the second substrate 11), an upper surface of the third substrate 13 (a surface facing a lower surface of the second substrate 12), an upper surface of the fourth substrate 14 (a surface facing a lower surface of the third substrate 13), and an upper surface of the fifth substrate 15 (a surface facing a lower surface of the fourth substrate 14) respectively constitute element forming surfaces 21, 31, 41, and 51 to form various kinds of elements.

One reason why the dielectric base 17 is formed by a multi-layered body is to mechanically and electrically protect, by covering the element forming surface 21 of the second substrate 12 with the first substrate 11, an element and so on formed thereon. It is also possible to form the dielectric base 17 in a four-layer structure by omitting the first substrate 11 for some reason or by adopting some other method. It is further possible to omit the fifth substrate 15 if it is thought to be unnecessary. In contrast, it is also possible to further layer another layer substrate or other layer substrates (not shown) to form the dielectric base 17 in a six-layer or seven or more-layer structure. A capacitance component and an inductance component can be adjusted by making dielectric constants or magnetic permeabilities of members forming respective substrates different from each other or by interposing between substrates a substrate made of a member identical with or different from the substrates. The reason why the dielectric base 17 is formed in a rectangular parallelepiped shape is to allow the dielectric base to be easily produced by a multi-cavity molding by so-called dicer cutting or the like. It is needless to say that the dielectric base may be formed in other shapes. Incidentally, on a rear surface of the fifth substrate 15, a dummy electrode (not shown) for firmly soldering the dielectric antenna 10 onto a parent substrate (not shown) is provided. At the time of mounting on the parent substrate (not shown), a power feeding terminal 19 formed on an end face of the dielectric base 17 is connected to a power feeding portion P of the parent substrate and a GND terminal 20 also formed on the end face of the dielectric base 17 is connected to a ground portion G thereof respectively by soldering.

(Configurations of Elements)

An explanation will be given with reference to FIG. 8 to FIG. 10. An antenna (radiation element) and an antenna matching circuit formed in the dielectric antenna 10 are as shown in FIG. 9a, and have the same structures as the antenna and the antenna matching circuit shown in FIG. 3. Accordingly, the same numerals and symbols as in FIG. 3 are used for the antenna and the antenna matching circuit shown in FIG. 9a. As described above, the parallel resonant section 3 included in the antenna matching circuit A3 is composed of the inductance component L1 and the inductance component L3 which are connected in series and the inductance component L2 and the capacitance component C1 which are connected in series.

Here, the inductance component L1 is formed by a first matching element 23 having an upside down U shape on the element forming surface 21 of the second substrate 12. One end of the first matching element 23 is connected to the power feeding terminal 19, and the other end thereof is connected to the GND terminal 20. A radiation element 33 having a substantially L shape is formed on the element forming surface 31 of the third substrate 13. The radiation element 33 constitutes the antenna A. One end of the radiation element 33 is open on the element forming surface 31, and a base end thereof is connected to the GND terminal 20. The inductance component L2 is formed by a second matching element 43 having a substantially L shape on the element forming surface 41 of the fourth substrate 14. A base end of the second matching element 43 is connected to the power feeding terminal 19, and an open end 43a thereof is formed wider than other portions. The reason why the open end 43a is formed wider is in order to adjust a capacitance component between the radiation element 33 and the open end 43a. Namely, the radiation element 33 and the second matching element 43 (open end 43a) form a capacitor structure via the third substrate 13 which is a dielectric, and the open end 43a is formed wider so that opposed areas of the radiation element 33 serving as one electrode of this capacitor structure and the second matching element 43 serving as the other electrode can be easily adjusted. The capacitance component C1 is formed by this capacitor structure. A rectangular GND element 53 is formed on the element forming surface 51 of the fifth substrate 15, and one end of this GND element 53 is connected to the GND terminal 20. The GND element 53 forms a capacitor structure with the open end 43a of the second matching element 43 with the fourth substrate 14 as a dielectric, and the capacitance component C2 is formed by this capacitor structure. Out of constituent portions of the GND terminal 20, a portion between the other end of the first matching element 23 and the base end of the radiation element 33 forms the inductance component L3, and a portion between the base end of the radiation element 33 and GND element 53 forms the inductance component L4.

The resonant frequency of the radiation element 33 is set at a relatively high frequency band of 5 GHz band, hence parasitic inductances La and Lb, and the like occur in the power feeding terminal 19, and by performing structural design in which these parasitic inductances are reflected, it is possible to widen the band of the antenna.

The respective elements 23, 33, 43, and 53 may be formed by any method, but it is convenient to form them by a method of printing a conductive paste. This is because pattern printing is suitable for mass production, and besides variations in mass production can be reduced. It is also convenient to form the power feeding terminal 19 and the GND terminal 20 by the same method as above.

VSWR characteristics when the aforementioned dielectric antenna 10 is formed by a dielectric base with dimensions of 5.0×2.0×0.8 mm and the resonant frequency is set to the 5 GHz band are as shown in FIG. 11 according to an electromagnetic field simulation. As explained in "Description of the Related Art", while a band with the VSWR of 2 or less is 76 MHz at most according to the conventional means, a band of almost 1 GHz can be secured according to the dielectric antenna 10 although its theoretical basis is being elucidated now (Modification examples of the Embodiment)

Subsequently, a first modification example of this embodiment will be explained based on FIG. 12 to FIG. 14. As shown in FIG. 13, a dielectric antenna 61 includes an antenna (radiation element) A and an antenna matching circuit A6. A parallel resonant section 3 included in the antenna matching circuit A6 is composed of an inductance component L1 and a capacitance component C which are connected in series and an inductance component L2 and an inductance component L3 which are connected in series.

Here, the inductance component L3 is formed by a first matching element 64 having an upside-down U shape on an element forming surface of a first substrate 63. One end of the first matching element 64 is connected to a power feeding terminal 29, and the other end thereof is connected to a GND terminal 30. A radiation element 66 having a substantially L shape is formed on an element forming surface of a second substrate 65. The radiation element 66 constitutes the antenna A. One end of the radiation element 66 is open on the element forming surface, and a base end thereof is connected to the power feeding terminal 29. The inductance component L2 is formed by the GND terminal 30. The inductance component L1 is formed by a second matching element 68 having a substantially L shape on an element forming surface of a third substrate 67. A base end of the second matching element 68 is connected to the power feeding terminal 29, and an open end 68a thereof is formed wider than other portions. The reason why the open end 68a is formed wider is in order to adjust a capacitance component between a GND element 70a and the open end 68a. Namely, the GND element 70a and the second matching element 68 (open end 68a) form a capacitor structure via the third substrate 67 which is a dielectric, and the open end 68a is formed wider so that opposed areas of the GND element 70a serving as one electrode of this capacitor structure and the second matching element 68 serving as the other electrode can be easily adjusted. The capacitance component C is formed by this capacitor structure.

Concerning VSWR characteristics when the aforementioned dielectric antenna 61 is formed by a dielectric base with dimensions of 5×2×0.8 mm and the resonant frequency is set to the 5 GHz band, as shown in FIG. 14, a band of almost 1 GHz from 5.02 GHz to 6.02 GHz approximately can be secured also by the dielectric antenna 61.

A second modification example of this embodiment will be explained based on FIG. 15a to FIG. 15c. A dielectric antenna according to the second modification example can be regarded as one aspect of a case where the aforementioned antenna matching circuit A1 is incorporated into the dielectric antenna. This also applies to a third modification example described later.

In a dielectric antenna 71 shown in FIG. 15b, a capacitor structure using a second substrate 75 as a dielectric is formed by a second matching element 78 on a third substrate 77 and a radiation element 76 on a second substrate 75, and a series resonant portion is composed of a capacitance component C of this capacitor structure and an inductance component L2 of the second matching element 78. A first matching element 74 is formed on a first substrate 73, and a parallel resonant section is constructed by connecting an inductance component L1 of the first matching element 74 in parallel with the aforementioned series resonant portion. This formation of the first matching element 74, the radiation element 76, and the second matching element 78 on separate dielectric layers of the first substrate 73, the second substrate 75, and the third substrate 77 makes it possible to enlarge occupied areas of the respective elements. If the occupied arrears can be enlarged, the values of the inductance component L1 and the inductance component L2 can be sufficiently large, which is beneficial in securing the degree of freedom of design, but it is also possible to form the respective elements on a single substrate. Incidentally, as shown in FIG. 15c, there is a method of reducing the capacitive coupling between the first substrate 73 and the third substrate 75, that is, reducing the occurrence of a capacitance component between these two substrates by interposing an intermediate substrate 79 between these two substrates to increase the distance therebetween. When there is such a bad influence that the resonant frequency band is narrowed by the capacitive coupling between these two substrates, this method is effective in removing the bad influence.

A third modification example of this embodiment will be explained based on FIG. 16. In a dielectric antenna 81 according to the third modification example, a radiation element 84 and a first matching element 85 are both formed on a first substrate 83. A second matching element 88 is formed on a second substrate 87. As described just above, any pattern can be formed on any substrate appropriately.

A fourth modification example of this embodiment will be explained based on FIG. 17a and FIG. 17b. In a dielectric antenna 91 according to the fourth modification example, as shown in FIG. 17a, an inductance component L1 is placed on one side of a parallel resonant section, and an inductance component L2, a capacitance component C, and an inductance component L3 which are connected in series are placed on the other side. Namely, a first matching element 96 which constitutes the inductance component L1 is formed on a first substrate 92 which constitutes the dielectric antenna 91, and a radiation element 95 is formed on a second substrate 94. A second matching element 97 which constitutes the inductance component L2 is formed on a third substrate 96, and a third matching element 99 which constitutes the inductance component L3 is formed on a fourth substrate 98. The second matching element 97 and the third matching element 99 form a capacitor structure with the third substrate 96 as a dielectric, and the capacitance component C is formed by this capacitor structure. According to the dielectric antenna 91, an example of a case where a series resonant portion is constructed by providing the respective elements such as the second matching element 97 and the third matching element 99 on separate layers such as the third substrate 96 and the fourth substrate 98 and forming a capacitor structure by both the elements is shown, but irrespective of this construction, it is also possible to divide a pattern on one substrate and form a capacitor structure between the respective elements.

(Comparison with Prior Art)

A result of an experiment on an influence exerted on the width of bandwidth by a parasitic inductance will be explained based on FIG. 18a to FIG. 19b. A dielectric antenna according to the present invention is shown in FIG. 18a and FIG. 18b, and a dielectric antenna as a comparison object is shown in FIG. 19a and FIG. 19b. A meander-shaped slit 103a and linear slits 103b, . . . are formed in an end face terminal 103 of an dielectric antenna 101 shown in FIG. 18a so that an inductance component L and a capacitance component C occur as shown in FIG. 18b. A numeral 105 shown in FIG. 18b denotes a radiation element connected to the end face terminal 103. On the other hand, a meander-shaped slit 113a which is the same as the aforementioned slit 103a is formed in an end face terminal 113 of a dielectric antenna 111 shown in FIG. 19a and FIG. 19b. Such a linear slit as the slit 103b is not formed. As a result, only a capacitance component C is formed in the end face terminal 113, but no inductance component is formed. An inductance component which can occur in the end face terminal 113 is only an inductance component due to parasitic. Incidentally, a numeral 115 shown in FIG. 19b denotes a radiation element connected to the end face terminal 113.

Hence, if the dielectric antenna 101 and the dielectric antenna 111 are compared in terms of bandwidth, at a frequency band of 5 GHz, the former can secure a bandwidth of approximately 1 GHz, whereas the latter can secure only 500 MHz. From this it turns out that an inductance component which constitutes an antenna matching circuit needs to be formed in a positive manner, and that an inductance component due to parasitic hardly contributes to an increase in bandwidth.

(Structure of Communication Device)

An explanation will be given based on FIG. 20. A numeral 117 shown in FIG. 20 denotes a personal computer which functions as a communication device. The personal computer 117 is equipped with the aforementioned dielectric antenna, for example, the dielectric antenna 10, and it includes a power feeding means 119 for feeding power to the radiation element 33 (See FIG. 8) of the dielectric antenna 10. As described above, the dielectric antenna 10 can be used in a wide band of approximately 1 GHz, whereby the personal computer 117 can be used worldwide by making the power feeding means 119 itself usable in this band. The aforementioned dielectric antenna 10 or the like can be applied to others than this personal computer 117, and, for example, it can be suitably used for a cellular phone, a transceiver, and so on in addition to various kinds of PDAs (Personal Digital Aids).

According to the present invention, antenna matching technology effective in widening the band can be provided. Accordingly, a single antenna enables good communication in a wide band.

What is claimed is:

1. A dielectric antenna in which a radiation element pattern and a parallel resonant type matching section connected to said radiation element pattern are formed on a dielectric substrate, wherein said matching section comprises:
    a series resonant portion composed of a first equivalent inductance pattern and a capacitive coupling portion; and
    a second equivalent inductance pattern connected in parallel with said series resonant portion.

2. The dielectric antenna according to claim 1, wherein said matching section is formed between said radiation element pattern and a feeding point of said radiation element pattern.

3. The dielectric antenna according to claim 1, wherein said matching section is formed between said radiation element pattern and a ground point of said radiation element pattern.

4. The dielectric antenna according to claim 1, wherein said first equivalent inductance pattern and said radiation element pattern are formed on separate dielectric substrates, and wherein said capacitive coupling portion is formed by using interlayer coupling between said first equivalent inductance pattern and said radiation element pattern.

5. The dielectric antenna according to claim 1, wherein said capacitive coupling portion is formed by using interlayer coupling which occurs between said first equivalent inductance pattern and a grounding terminal electrode of said radiation element pattern.

6. The dielectric antenna according to claim 1, wherein said capacitive coupling portion is formed by dividing said first equivalent inductance pattern on one dielectric substrate and using capacitive coupling which occurs between patterns resulting from the division.

7. The dielectric antenna according to claim 1, wherein said capacitive coupling portion is formed by using capacitive coupling which occurs between a power feeding terminal and a grounding terminal of said radiation element pattern, and wherein said first equivalent inductance pattern is formed in the power feeding terminal or the grounding terminal.

8. The dielectric antenna according to claim 1, wherein said first and/or said second equivalent inductance pattern is provided separately from a parasitic inductance which occurs in said capacitive coupling portion.

9. The dielectric antenna according to claim 1, wherein said second equivalent inductance pattern, said radiation element pattern, and said series resonant portion are formed on separate dielectric substrates and layered in this order.

10. The dielectric antenna according to claim 9, wherein an intermediate layer is interposed between said second equivalent inductance pattern and said radiation element pattern.

11. An antenna matching circuit comprising a parallel resonant section which is connected to a radiation element constituting an antenna,
wherein said parallel resonant section includes a series resonant portion composed of an inductance component and a capacitance component, wherein said parallel resonant section is inserted in a GND line connected to said radiation element; and
wherein at least a portion of said parallel resonant section is disposed on a dielectric substrate with the radiation element.

12. A communication device comprising a radiation element comprising an antenna, an antenna matching circuit connected to said radiation element, and a power feeding means for feeding power to said radiation element,
wherein said matching circuit is formed by a parallel resonant circuit which includes a series resonant portion composed of an inductance component and a capacitance component; and
wherein a portion of said matching circuit is disposed on a dielectric substrate with said antenna.

13. The communication device according to claim 12, wherein said parallel resonant circuit is placed between an output of said power feeding means and an input of said radiation element.

14. The communication device according to claim 12, wherein said parallel resonant circuit is placed between said radiation element and a ground point of said radiation element.

15. An antenna comprising:
a parallel resonant type matching circuit connected to a radiation element, wherein said matching circuit includes a series resonant portion composed of an inductance component and a capacitance component;
wherein said matching circuit is inserted in a GND line connected to said radiation element; and
wherein a portion of said matching circuit is formed on a dielectric substrate with said radiation element.

* * * * *